(12) United States Patent
Ueno

(10) Patent No.: US 12,009,390 B2
(45) Date of Patent: Jun. 11, 2024

(54) VERTICAL MOSFET HAVING A HIGH RESISTANCE REGION

(71) Applicant: FUJI ELECTRIC CO., LTD., Kanagawa (JP)

(72) Inventor: Katsunori Ueno, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 17/709,383

(22) Filed: Mar. 30, 2022

(65) Prior Publication Data

US 2022/0223681 A1 Jul. 14, 2022

Related U.S. Application Data

(62) Division of application No. 15/663,808, filed on Jul. 30, 2017, now abandoned.

(30) Foreign Application Priority Data

Aug. 24, 2016 (JP) .................................. 2016-163995

(51) Int. Cl.
*H01L 29/78* (2006.01)
*H01L 29/06* (2006.01)
(Continued)

(52) U.S. Cl.
CPC ........ *H01L 29/063* (2013.01); *H01L 29/0623* (2013.01); *H01L 29/0878* (2013.01);
(Continued)

(58) Field of Classification Search
CPC ............... H01L 29/063; H01L 29/0623; H01L 29/0878; H01L 29/1095; H01L 29/1608;
(Continued)

(56) References Cited

U.S. PATENT DOCUMENTS 5,877,047 A * 3/1999 Weitzel ............... H01L 29/1608
438/173
6,432,788 B1 8/2002 Maruska
(Continued)

FOREIGN PATENT DOCUMENTS

JP 2003-516631 A 5/2003
JP 2005-510061 A 4/2005
(Continued)

OTHER PUBLICATIONS

Office Action issued for counterpart Japanese Application 2016-163995, issued by the Japan Patent Office dated Oct. 18, 2016.
(Continued)

*Primary Examiner* — David Chen

(57) ABSTRACT

A vertical MOSFET having a compound semiconductor layer is provided, the vertical MOSFET comprising a gate electrode, a gate insulating film provided between the gate electrode and the compound semiconductor layer, a drift region provided directly in contact with at least a part of the gate insulating film and being a part of the compound semiconductor layer, and a high resistance region provided at least in the drift region, is positioned below at least a part of the gate insulating film, and has a higher resistance value per unit length than that of the drift region.

11 Claims, 29 Drawing Sheets

(51) Int. Cl.
*H01L 29/08* (2006.01)
*H01L 29/10* (2006.01)
*H01L 29/16* (2006.01)
*H01L 29/20* (2006.01)
*H01L 29/66* (2006.01)
*H01L 21/04* (2006.01)
*H01L 21/265* (2006.01)
*H01L 21/324* (2006.01)

(52) U.S. Cl.
CPC ...... *H01L 29/1095* (2013.01); *H01L 29/1608* (2013.01); *H01L 29/2003* (2013.01); *H01L 29/66068* (2013.01); *H01L 29/66712* (2013.01); *H01L 29/66734* (2013.01); *H01L 29/7802* (2013.01); *H01L 29/7813* (2013.01); *H01L 21/046* (2013.01); *H01L 21/26546* (2013.01); *H01L 21/3245* (2013.01)

(58) Field of Classification Search
CPC .......... H01L 29/2003; H01L 29/66068; H01L 29/66712; H01L 29/66734; H01L 29/7802; H01L 29/7813; H01L 21/046; H01L 21/26546; H01L 21/3245
USPC .......... 257/315, 330, 367, E21.41, E29.133, 257/E29.262
See application file for complete search history.

(56) References Cited

U.S. PATENT DOCUMENTS

| | | |
|---|---|---|
| 7,229,493 B2 | 6/2007 | Tsuchida |
| 2002/0121641 A1 | 9/2002 | Alok et al. |
| 2003/0094650 A1 | 5/2003 | Huang et al. |
| 2006/0270103 A1 | 11/2006 | Das et al. |
| 2007/0187695 A1 | 8/2007 | Nakamura et al. |
| 2008/0035987 A1 | 2/2008 | Hebert |
| 2008/0099836 A1 | 5/2008 | Matsuura |
| 2009/0206924 A1 | 8/2009 | Zeng et al. |
| 2010/0187598 A1 | 7/2010 | Endo |
| 2010/0224932 A1 | 9/2010 | Takaya |
| 2010/0244041 A1* | 9/2010 | Oishi ................. H01L 29/0688 257/E29.091 |
| 2012/0119228 A1 | 5/2012 | Hsia |
| 2014/0091364 A1 | 4/2014 | Imanishi |
| 2015/0179741 A1 | 6/2015 | Umeda et al. |
| 2016/0093495 A1 | 3/2016 | Agraffeil |
| 2016/0211319 A1* | 7/2016 | Saito .................. H01L 29/7813 |
| 2016/0211334 A1* | 7/2016 | Tanaka ............... H01L 29/7813 |
| 2016/0329422 A1 | 11/2016 | Saito et al. |
| 2017/0148906 A1* | 5/2017 | Iucolano ............. H01L 21/0254 |
| 2017/0271323 A1 | 9/2017 | Sugawara |
| 2017/0338302 A1* | 11/2017 | Hsieh ............... H01L 29/66348 |

FOREIGN PATENT DOCUMENTS

| | | |
|---|---|---|
| JP | 2007-87985 A | 4/2007 |
| JP | 2007-194283 A | 8/2007 |
| JP | 2008-543048 A | 11/2008 |
| JP | 2011-512677 A | 4/2011 |
| JP | 2013-34031 A | 2/2013 |
| JP | 2015-126080 A | 7/2015 |
| JP | 2015-126085 A | 7/2015 |
| JP | 2016-42595 A | 3/2016 |
| WO | 2014/041731 A1 | 3/2014 |

OTHER PUBLICATIONS

Office Action issued for counterpart Japanese Application 2016-163995, issued by the Japan Patent Office dated Mar. 7, 2017.
Office Action issued for counterpart Japanese Application 2016-163995, issued by the Japan Patent Office dated Jun. 6, 2017.
Tohru Oka et al., "Vertical GaN-based trench metal oxide semiconductor field-effect transistors on a free-standing GaN substrate with blocking voltage of 1.6 kV", Applied Physics Express, published Jan. 28, 2014, vol. 7, No. 2, 021002.
Those references were submitted as IDS or found by the examiner over the earlier U.S. Appl. No. 15/663,808, filed Jul. 30, 2017.

* cited by examiner

S10

S50

VERTICAL MOSFET HAVING A HIGH RESISTANCE REGION

CROSS-REFERENCE TO RELATED APPLICATIONS

This application is a divisional of U.S. patent application Ser. No. 15/663,808, filed on Jul. 30, 2017, which claims priority to Japanese Patent Application No. 2016-163995 filed in JP on Aug. 24, 2016, the contents of which is incorporated herein by reference in their entirety.

BACKGROUND

1. Technical Field

The present invention relates to a vertical MOSFET and a method of manufacturing the vertical MOSFET.

2. Related Art

It has been known that a trench gate electrode is provided in a compound semiconductor apparatus (for example, refer to Non-Patent Document 1). Also, it has been known that an insulating film is provided below the trench gate electrode (for example, refer to Patent Document 1).

PRIOR ART DOCUMENT

Non-Patent Document

[Non-Patent Document 1] Tohru Oka et al., "Vertical GaN-based trench metal oxide semiconductor field-effect transistors on a free-standing GaN substrate with blocking voltage of 1.6 kV", Applied Physics Express, published 28 Jan. 2014, Volume 7, Number 2, 021002

Patent Document

[Patent Document 1] Japanese Unexamined Patent Application Publication No. 2011-512677

In a bottom portion (particularly, a corner portion) of a trench, if a high voltage is applied between a source and a drain of a gate when the gate is turned off, an electric field is concentrated. Accordingly, there has been a problem that a breakdown or degradation of a gate insulating film is generated. In order to handle this problem, it is thought to provide a relatively thick insulating film to the bottom portion of the trench. However, since the avalanche breakdown generated in the insulating film is an irreversible breakdown phenomenon, once the breakdown of the insulating film is generated, it cannot be used for a second time.

SUMMARY

In a first aspect of the present invention, a vertical MOSFET having a compound semiconductor layer is provided. The vertical MOSFET may include a gate electrode, a gate insulating film, a drift region, and a high resistance region. A gate insulating film may be provided between the gate electrode and the compound semiconductor layer. The drift region may be provided directly in contact with at least a part of the gate insulating film. The drift region may be a part of the compound semiconductor layer. The high resistance region may be provided at least in the drift region. The high resistance region may be positioned below at least a part of the gate insulating film. A resistance value per unit length of the high resistance region may be higher than that of the drift region. The gate electrode may be a trench type gate electrode. The gate electrode may be embedded in a trench portion provided in the compound semiconductor layer. The high resistance region may be adjacent to a bottom portion of the trench portion. The high resistance region may be spaced from the gate insulating film below at least a part of the gate insulating film. A width of the high resistance region may be wider than a width of the trench portion. The high resistance region may have a resistance value per unit length of equal to or more than 10 Ω·cm. The compound semiconductor layer may be a gallium nitride layer.

In a second aspect of the present invention, a vertical MOSFET having a compound semiconductor layer is provided. The vertical MOSFET may include a gate electrode, a gate insulating film, a drift region, and a high resistance region. The gate insulating film may be provided between the gate electrode and the compound semiconductor layer. The drift region may be provided directly in contact with at least a part of the gate insulating film. The drift region may be a part of the compound semiconductor layer. The high resistance region may be provided at least in the drift region. The high resistance region may be positioned below at least a part of the gate insulating film. A resistance value per unit length of the high resistance region may be higher than that of the drift region. The gate electrode may be a planar type gate electrode provided above a front surface of the compound semiconductor layer. The high resistance region may be provided between a pair of base regions which are part of the compound semiconductor layer. The drift region may be remained among the pair of base regions and the high resistance region. A width of the high resistance region may be smaller than a width of the pair of base regions. If the compound semiconductor layer is a gallium nitride layer, a resistance-increasing element in the high resistance region may be nitrogen. If the compound semiconductor layer is a silicon carbide layer, the resistance-increasing element in the high resistance region may be silicon.

The resistance value per unit length of the high resistance region may be higher than a resistance value per unit length of the base regions which are part of the compound semiconductor layer.

The high resistance region may have a resistance-increasing element with a concentration of equal to or more than $1E+16$ cm$^{-3}$ and equal to or less than $1E+19$ cm$^{-3}$.

The resistance-increasing element may be different from an impurity element which forms majority carriers in the drift region.

The resistance-increasing element may be an impurity element which is the same as an impurity element forming majority carriers in the base region that is a part of the compound semiconductor layer.

The summary clause does not necessarily describe all necessary features of the embodiments of the present invention. The present invention may also be a sub-combination of the features described above.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
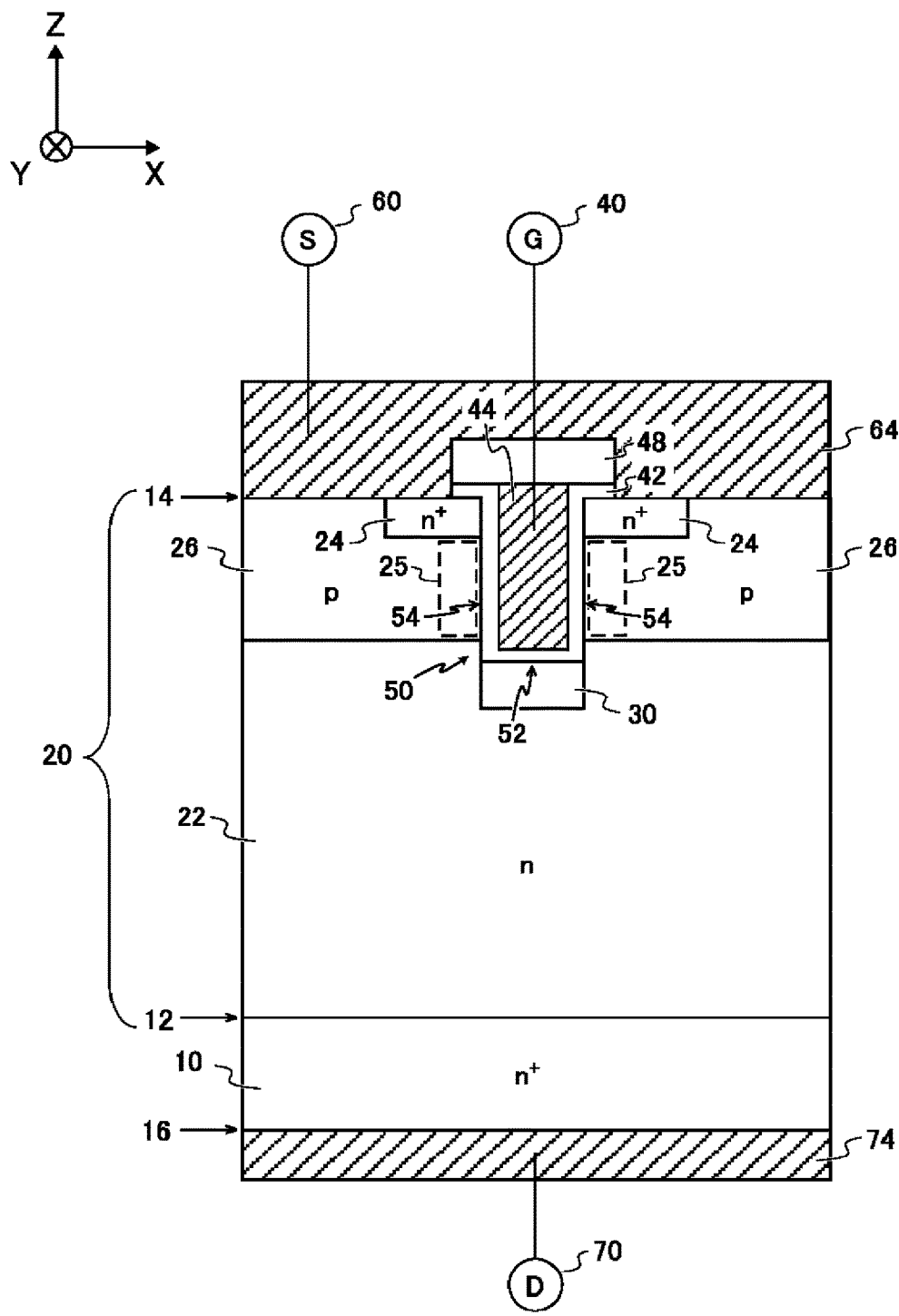
FIG. 1 is a schematic view showing a cross section of a vertical MOSFET 100 in a first embodiment.

FIG. 1 is a schematic view showing a cross section of a vertical MOSFET (Metal Oxide Semiconductor Field Effect Transistor) 100 in a first embodiment. FIG. 1 is an X-Z cross-sectional view of the vertical MOSFET 100 in an active region of a semiconductor chip. FIG. 1 may be a unit configuration of the vertical MOSFET 100. Note that in the present example, an X direction and a Y direction are directions perpendicular to each other, and a Z direction is a direction perpendicular to an X-Y plane. The X direction, the Y direction, and the Z direction form a so-called right-handed system.

The vertical MOSFET 100 of the present example includes an n$^+$ type gallium nitride (hereinafter, abbreviated to GaN) substrate 10, which is a compound semiconductor substrate, and a GaN layer 20 as a compound semiconductor layer. Note that n means that electrons are majority carriers while p means that holes are majority carriers. Regarding "+" or "−" placed on the upper right side of n or p, "+" means that a carrier concentration is higher than those for which "+" is not placed, and "−" means that the carrier concentration is lower than those for which "−" is not placed.

The compound semiconductor of the present example is GaN. However, the compound semiconductor in another example may be silicon carbide (hereinafter, abbreviated to SiC). That is, in the other example, the compound semiconductor substrate may be an n$^+$ type SiC substrate, and the compound semiconductor layer may be a SiC layer. The technical contents of the present example where the compound semiconductor is GaN may be applied to the above-described other example where the compound semiconductor is SiC. Explanation will be given on each occasion when there is particularly any different point between the present example and the above-described other example.

Ion species of the n type impurities for GaN may be one or more types of elements selected from among Si (silicon), Ge (germanium), and O (oxygen). In the present example, Si is used as the n type impurities. Also, ion species of the p type impurities for GaN may be one or more types of elements selected from among Mg (magnesium), Ca (calcium), Be (beryllium), and Zn (zinc). On the other hand, the ion species of the n type impurities for SiC may be one or more types of elements selected from among N (nitrogen) and P (phosphorus). Also, the ion species of the p type impurities for SiC may be one or more types of elements selected from among B (boron) and Al (aluminum).

The GaN substrate 10 of the present example is a free-standing substrate having a threading dislocation density of less than 1E+7 cm$^{-2}$. By setting the GaN substrate 10 to have a low dislocation density, the dislocation density of a GaN layer 20 which is epitaxially formed on the GaN substrate 10 may also be decreased. Note that in the present example, the terms "upper" and "above" mean +Z direction, and the term "below" means −Z direction. ±Z directions do not necessarily mean a vertical direction to the ground. The ±Z directions are merely convenient terms to specify a relative positional relation among the substrate, layer, region, film, and the like.

In the present example, a leak current of a power device may be reduced compared to a case where the threading dislocation density is equal to or more than 1E+7 cm$^{-2}$. Also, since ion-implanted impurities can be prevented from deeply diffusing following a dislocation during annealing, an impurity implantation region can be set to be closer to a design profile. In this way, the power device can be manufactured in a higher non-defective rate.

In the present example, a junction surface between the GaN substrate 10 and the GaN layer 20 is referred to as a boundary surface 12. The boundary surface 12 may be one of principal surfaces in the GaN substrate 10 and the GaN layer 20. In the present example, another principal surface of the GaN substrate 10 on the opposite side of the boundary surface 12 is referred to as a back surface 16 of the GaN substrate 10. Also, another principal surface of the GaN layer 20 on the opposite side of the boundary surface 12 is referred to as a front surface 14 of the GaN layer 20. In the present example, the boundary surface 12, the front surface 14, and the back surface 16 are parallel to the X-Y plane.

The GaN layer 20 of the present example has an n type drift region 22, an n$^+$ type source region 24, a p type base region 26, a high resistance region 30, and a trench portion 50. In the present example, the drift region 22, the source region 24, the base region 26, and the high resistance region 30 are part of the GaN layer 20. The trench portion 50 of the present example is a concave portion of the GaN layer 20. The trench portion 50 has a bottom portion 52 mainly in contact with the drift region 22, and side portions 54 mainly in contact with the base region 26.

The vertical MOSFET 100 has a gate insulating film 42 which is embedded in the trench portion 50, and a gate electrode 44. The gate insulating film 42 is provided between the gate electrode 44 and the GaN layer 20. The gate insulating film 42 of the present example is provided directly in contact with the bottom portion 52 and the side portions 54 of the trench portion 50. A part of the gate insulating film 42 may also be provided on the front surface 14 of the GaN layer 20. Note that the gate insulating film 42 provided on the side portions 54 means that the gate insulating film 42 covers the outermost surface of the side portions 54, and does not mean that the gate insulating film 42 is positioned in the +Z direction of the side portions 54.

The gate electrode 44 of the present example is a trench type. A part of the gate electrode 44 may be positioned above the front surface 14 of the GaN layer 20. An interlayer insulating film 48 is provided on a top portion of the gate insulating film 42 and a top portion of the gate electrode 44. The interlayer insulating film 48 electrically separates the gate electrode 44 from the source electrode 64.

The drift region 22 of the present example has a high resistance region 30. The high resistance region 30 within the drift region 22 may be adjacent to the bottom portion 52 of the trench portion 50 in the Z direction. That is, the high resistance region 30 of the present example is positioned below at least a part of the gate insulating film 42 and is directly in contact with the gate insulating film 42. The high resistance region 30 of the present example is directly in contact with the gate insulating film 42 provided on the bottom portion 52. Note that the drift region 22 may be directly in contact with the gate insulating film 42 provided on the bottom portion 52 in the X direction and the Y direction.

The source region 24 is provided in contact with the front surface 14 and the side portions 54 of the trench portion 50. The source region 24 is provided in a part of the base region 26. The source region 24 may be provided from the front surface 14 to a predetermined depth. At least a part of the source region 24 may be directly in contact with the source electrode 64 in the Z direction. The source region 24 may be a region with low resistance to electrons. The source region 24 of the present example allows access of electrons between the source electrode 64 and the base region 26.

A part of the base region 26 serves as a channel forming region 25. The channel forming region 25 may be adjacent to the side portion 54 of the trench portion 50 in the X direction. Also, the channel forming region 25 may be positioned between the drift region 22 and the source region 24 in the Z direction. In a case where a voltage equal to or more than a predetermined threshold is applied to the gate electrode 44, an inverting layer may be formed in the channel forming region 25.

For example, if the predetermined voltage is applied between the source electrode 64 and a drain electrode 74 and a voltage equal to or more than a threshold voltage is applied from the gate terminal 40 to the gate electrode 44 (the gate is turned on), the inverting layer is formed in the channel forming region 25. Accordingly, currents flow from a drain terminal 70 to a source terminal 60. Also, if a voltage lower than the threshold voltage is applied to the gate electrode 44 (the gate is turned off), the inverting layer in the channel forming region 25 is eliminated. Accordingly, the currents are interrupted. In this way, the vertical MOSFET 100 may switch on/off the currents between the source terminal 60 and the drain terminal 70.

Although the high resistance region 30 of the present example is a region of the compound semiconductor, the high resistance region 30 is a region having as few free carriers so as to be able to be regarded as an insulator. The high resistance region 30 may have a function to protect the gate insulating film 42 in the bottom portion 52 (including its corner portion) when the gate is turned off. The high resistance region 30 of the present example is provided between the bottom portion 52 and the drift region 22. The high resistance region 30 of the present example is a region, into which the resistance-increasing element is ion-implanted, of the drift region 22 below the bottom portion 52.

The high resistance region 30 of the present example is not an insulator such as silicon oxide, silicon nitride, or the like, and is a part of the GaN layer 20 on which the ion implantation has been performed. That is, the high resistance region 30 is a part of the compound semiconductor layer. For this reason, the high resistance region 30 is advantageous in the point that even if the avalanche breakdown is generated, the irreversible breakdown like that in the insulator is not generated in the high resistance region 30.

Note that, different from the present example, in order to form a relatively thick insulating film on the bottom portion 52 of the trench portion 50, a special process, such as reflow and the like after deposition of the insulating film, is required. On the other hand, in the present example, the high resistance region 30 may be formed according to simple processes of ion implantation of the resistance-increasing element and annealing after the ion implantation.

The resistance-increasing element of the present example is the ion species to be ion-implanted into the drift region 22 in order to form the high resistance region 30. The resistance-increasing element may be an impurity element which is the same as an impurity element that forms majority carriers in the base region 26. By the resistance-increasing element, a part of the drift region 22 may be counter-doped. Also, crystallinity of a part of the drift region 22 may also be broken. Accordingly, the resistance of the region into which the resistance-increasing element is ion-implanted may be increased. In the present example, since the impurity element forming the majority carriers in the base region 26 is Mg, the resistance-increasing element may be Mg. Note that as for the other example where the compound semiconductor is SiC, since the impurity element forming the majority carriers in the base region 26 is Al, the resistance-increasing element may be Al.

The resistance-increasing element may be different from the impurity element forming the majority carriers in the drift region 22. According to the resistance-increasing element, the crystallinity of a part of the drift region 22 may be broken so as to increase the resistance. In the present example, the impurity element forming the majority carriers in the drift region 22 is Si, and the resistance-increasing element is Mg, Ar (argon), or N. Note that in the other example where the compound semiconductor is SiC, the impurity element forming the majority carriers in the drift region 22 is N or P, and the resistance-increasing element is Al, Ar, or Si. Note that the resistance-increasing element may have one or more of the above-described plurality of elements.

The high resistance region 30 may have a resistance-increasing element with a concentration of equal to or more than $1E+16$ cm$^{-3}$ and equal to or less than $1E+19$ cm$^{-3}$. Although the high resistance region 30 of the present example has an impurity concentration within the above-described range, hole carriers enough to be able to be defined as the p type region do not exist in the high resistance region 30 of the present example. In the present example, after the ion implantation of the resistance-increasing element is performed, the GaN layer 20 is annealed at a temperature within a range that the p type impurities are not activated. For this reason, no p type characteristics are exhibited in the high resistance region 30. Also, although the high resistance region 30 of the present example has the impurities with a concentration within the above-described range, the high resistance region 30 of the present example is not the n type region, either. Since the high resistance region 30 is a region which does not have any specific conductivity type (p type and n type) (even if it is assumed that the high resistance region 30 has a conductivity type, it is of very low concentration), the high resistance region 30 may have the electrical characteristics like the insulator.

The high resistance region 30 of the present example has a higher resistance value per unit length than that of the drift region 22. In the present example, the resistance value per unit length means a linear resistance. A value of the linear resistance of the drift region 22 depends on the withstand voltage class, and is, for example, 1 Ω·cm. On the other hand, the linear resistance of the high resistance region 30 is, for example, equal to or more than 10 Ω·cm. The linear resistance of the high resistance region 30 may be twice or more of the linear resistance of the drift region 22, or may be 5 times or more, 10 times or more, or 20 times or more of the linear resistance of the drift region 22.

Also, it is desirable that the resistance value per unit length of the high resistance region 30 of the present example is higher than the resistance value per unit length of the base region 26. The linear resistance of the base region 26 is 3 Ω·cm, for example. The linear resistance of the high resistance region 30 may be twice or more of the linear resistance of the base region 26, or may be 5 times or more, 10 times or more, or 20 times or more of the linear resistance of the base region 26.

Figure 2:
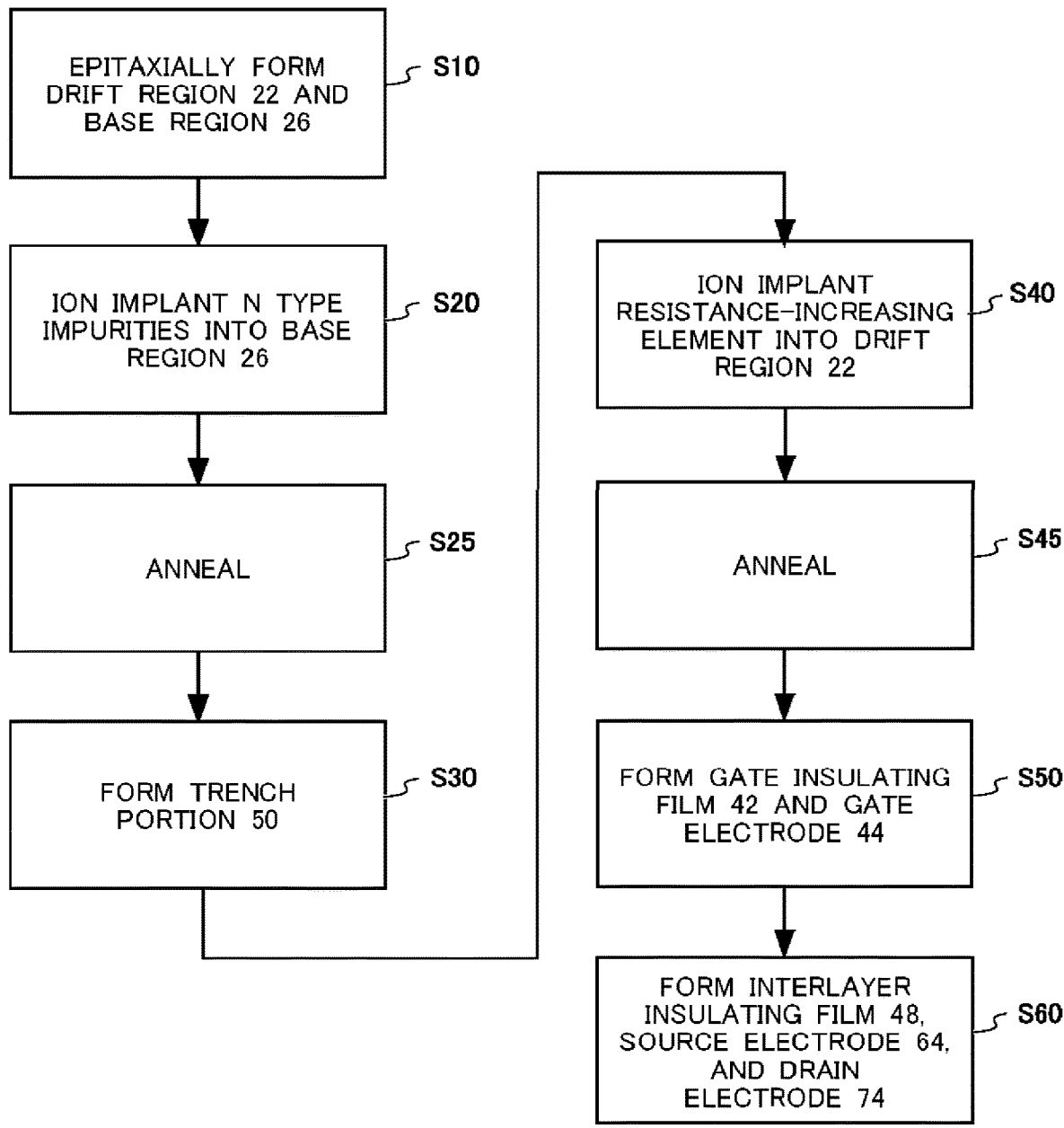
FIG. 2 is a flow diagram showing manufacturing steps of the vertical MOSFET 100.

FIG. 2 is a flow diagram showing manufacturing steps of the vertical MOSFET 100. The manufacturing steps of the present example are performed in an order of S10 to S60. The manufacturing steps of the present example include a step (S10) of epitaxially forming the drift region 22 and the base region 26, a step (S20) of ion implanting the n type impurities into the base region 26, a step (S25) of annealing the GaN layer 20 to form the source region 24, a step (S30) of forming the trench portion 50, a step (S40) of ion implanting the resistance-increasing element into the drift region 22 from the bottom portion 52 of the trench, a step (S45) of annealing the GaN layer 20 to form the high resistance region 30, a step (S50) of forming the gate insulating film 42 and the like, and a step (S60) of forming the interlayer insulating film 48 and the like.

Figure 3A:
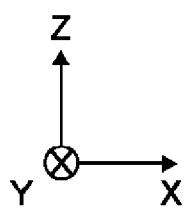
FIG. 3A is a schematic view showing a step S10.
Figure 3A:
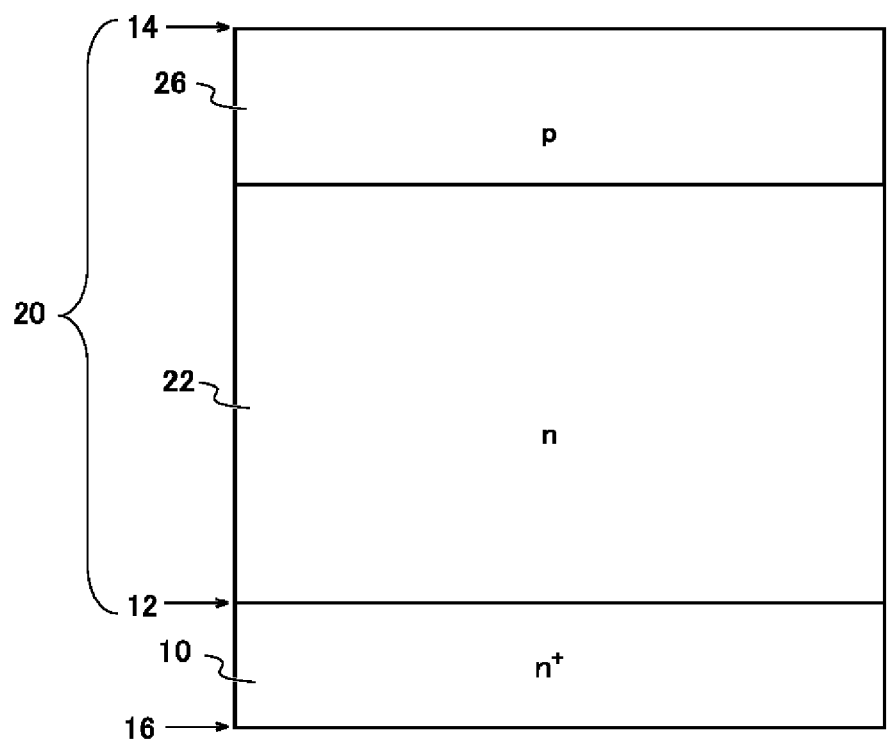

FIG. 3A is a schematic view showing the step S10. In the step S10, the drift region 22 is epitaxially formed on the GaN substrate 10 according to metal organic chemical vapor deposition (MOCVD), halide vapor phase epitaxy (HYPE), or the like. After this, the base region 26 is epitaxially formed on the drift region 22.

The drift region 22 may have an appropriate thickness in accordance with the withstand voltage. For example, the drift region 22 has the thickness of equal to or more than 1 μm and equal to or less than 50 μm in the Z direction. The drift region 22 of the present example is the n type region having the n type impurities of equal to or more than $1.0E+15$ cm$^{-3}$ and equal to or less than $5.0E+16$ cm$^{-3}$. Note that E represents a power of 10. For example, $1.0E+16$ means $1.0 \times 10^{16}$. The base region 26 may have the thickness of equal to or more than 0.5 μm and equal to or less than 2 μm in the Z direction. The base region 26 is the p type region having the p type impurities of equal to or more than $1.0E+17$ cm$^{-3}$ and equal to or less than $1.0E+18$ cm$^{-3}$.

Figure 3B:
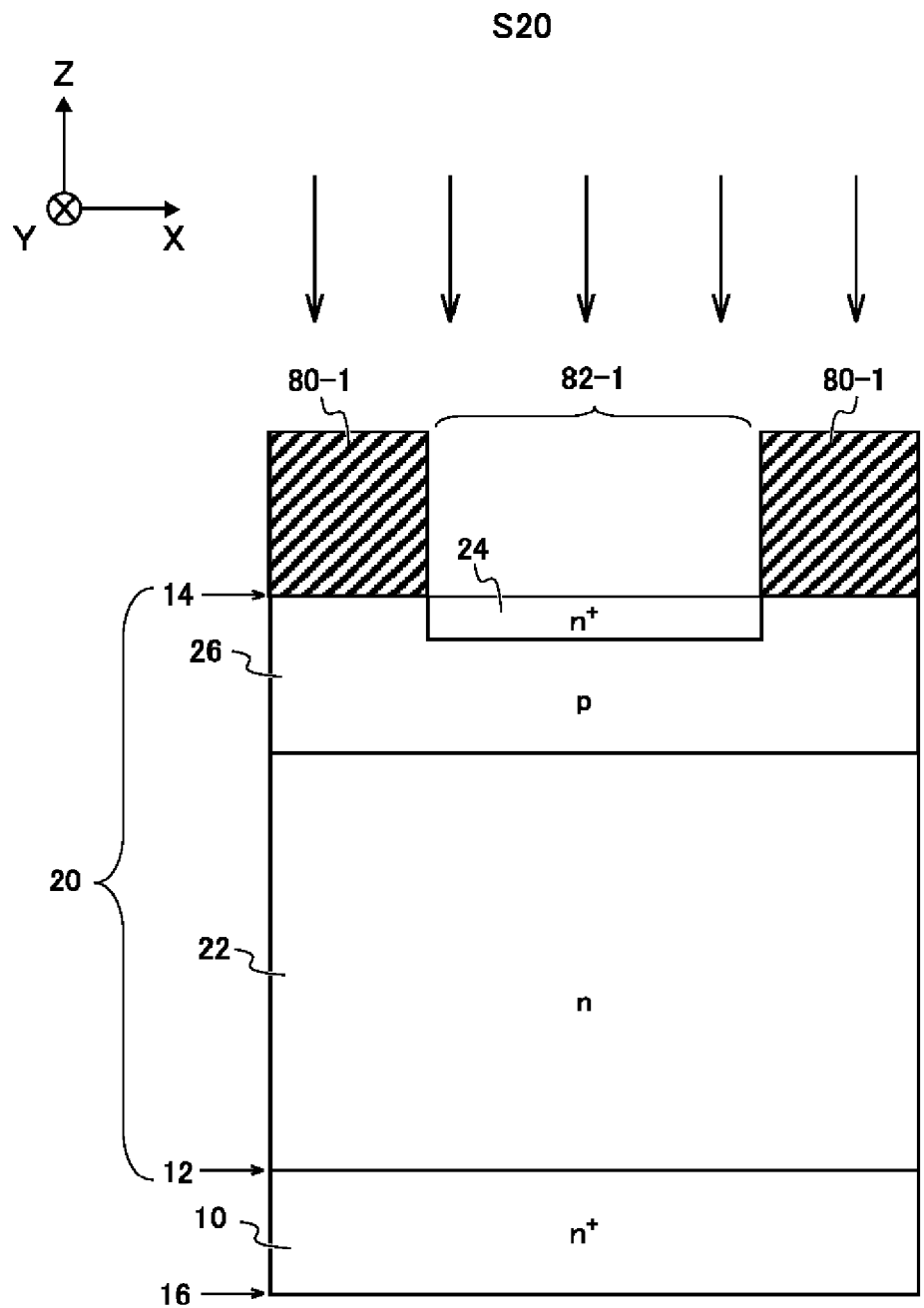
FIG. 3B is a schematic view showing a step S20.

FIG. 3B is a schematic view showing the step S20. In the step S20 of the present example, the source region 24 is formed by ion implantation. In the present example, the n type impurities are ion-implanted into the base region 26 via a mask 80-1. In the present example, Si is ion-implanted into the base region 26 by multi-stage implantation with a dosage of equal to or more than $1E+15$ cm$^{-2}$ and equal to or less than $1E+16$ cm$^{-2}$ at acceleration voltages of 10 keV, 20 keV, 40 keV, 70 keV, 110 keV, and 150 keV. A box profile is formed by reducing the dosage as the acceleration voltage is smaller and increasing the dosage as the acceleration voltage is larger. An ion implantation depth of the present example is set to be equal to or more than 0.1 μm and equal to or less than 0.5 μm from the front surface 14. The source region 24 of the present example is the n$^+$ type region having a Si concentration of equal to or more than $1.0E+18$ cm$^{-3}$ and equal to or less than $1.0E+19$ cm$^{-3}$.

The mask 80-1 of the present example has an opening 82-1 in a position into which the n type impurities are ion-implanted. The material of the mask 80 may be silicon dioxide (hereinafter, abbreviated to SiO$_2$) which can be selectively removed for GaN. In another example, the material of the mask 80 may be photoresist. The mask 80-1 of the present example is selectively removed from the GaN layer 20 after the ion implantation is performed.

Figure 3C:
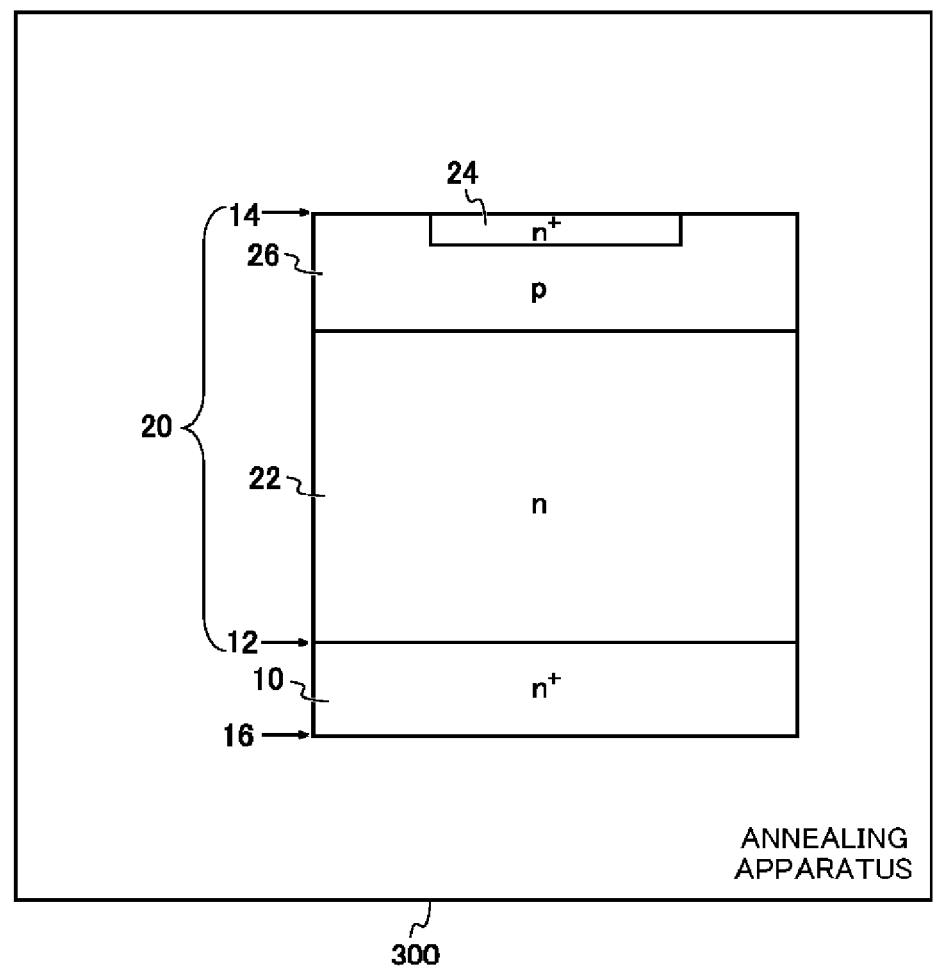
FIG. 3C is a schematic view showing a step S25.

FIG. 3C is a schematic view showing the step S25. In the step S25 of the present example, the GaN layer 20 is annealed by using an annealing apparatus 300 at a temperature of equal to or more than 1000° C. and equal to or less than 1200° C. In the present example, the annealing of GaN layer 20 means that the laminated body of the GaN substrate 10 and the GaN layer 20 is annealed at a treatment chamber of the annealing apparatus 300. According to the annealing, defects generated due to the ion implantation are repaired to some extent and the n type impurities are activated. Note that in another example, the front surface 14 side of the base region 26 may be partially removed by etching to selectively regrow the n$^+$ type source region 24 in the removed region. In a case where the regrowing is to be performed, the step S25 of annealing may be omitted.

Figure 3D:
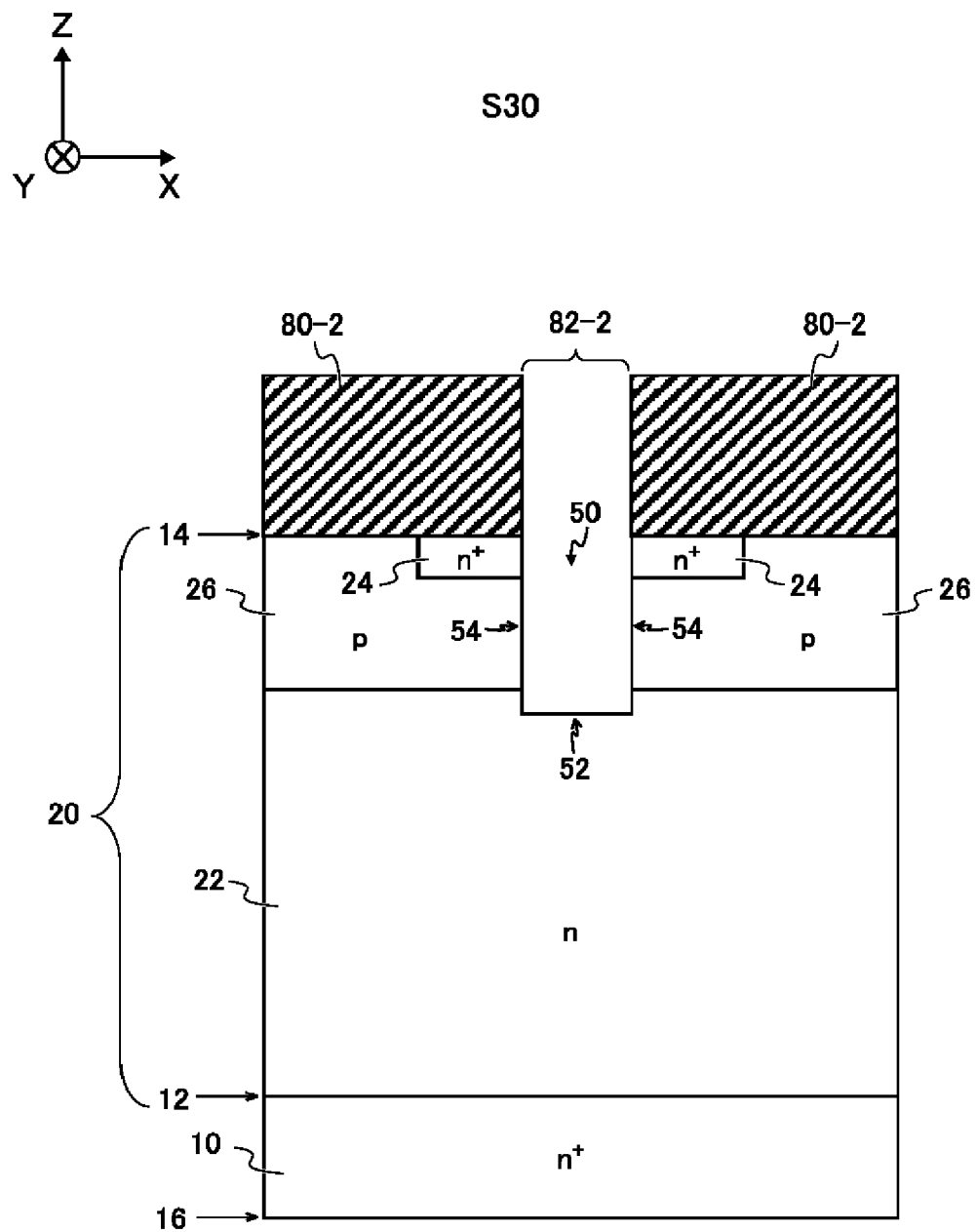
FIG. 3D is a schematic view showing a step S30.

FIG. 3D is a schematic view showing the step S30. In the step S30 of the present example, the GaN layer 20 is partially removed by etching via a mask 80-2 to form the trench portion 50. In the present example, the base region 26 below an opening 82-2 of the mask 80-2 is completely removed and an upper portion of the drift region 22 is partially removed.

Figure 3E:
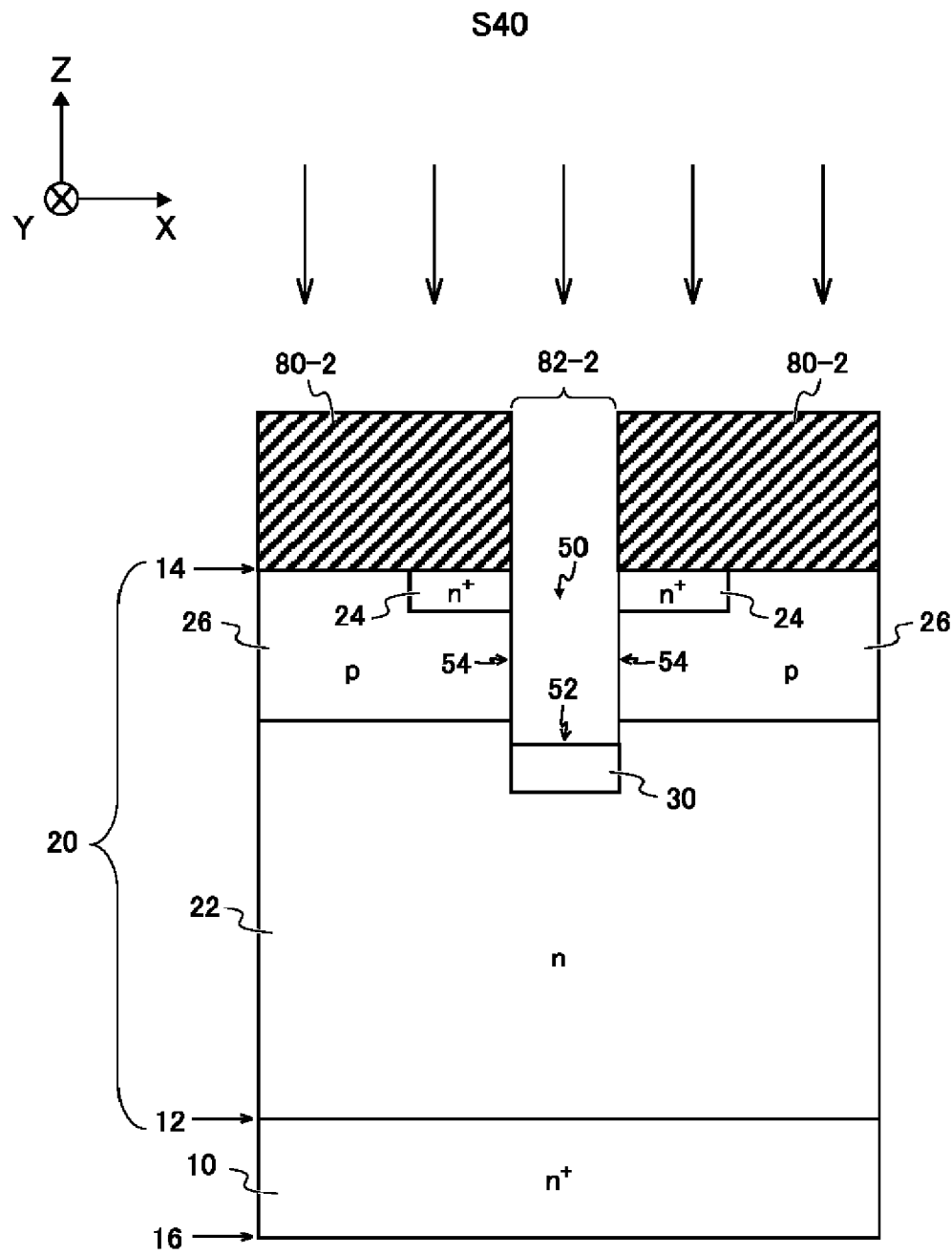
FIG. 3E is a schematic view showing a step S40.

FIG. 3E is a schematic view showing the step S40. In the step S40 of the present example, the resistance-increasing element is ion-implanted into the drift region 22 by continuously using the mask 80-2 of the step S30. The resistance-increasing element of the present example is Mg. In the present example, Mg is ion-implanted into the drift region 22 by multi-stage implantation with a dosage of equal to or more than $1E+12$ cm$^{-2}$ and equal to or less than $1E+15$ cm$^{-2}$ at acceleration voltages of 30 keV, 80 keV, and 180 keV. The ion implantation depth of the present example is set to be equal to or more than 0.5 μm and equal to or less than 2.0 μm from the bottom portion 52.

In the present example, the region where the ion implantation is performed has Mg with an impurity concentration of equal to or more than $1.0E+16$ cm$^{-3}$ and equal to or less than $1.0E+19$ cm$^{-3}$. The region may have a higher p type impurity concentration than that of the base region 26. The region becomes the high resistance region 30 through the annealing process.

Figure 3F:
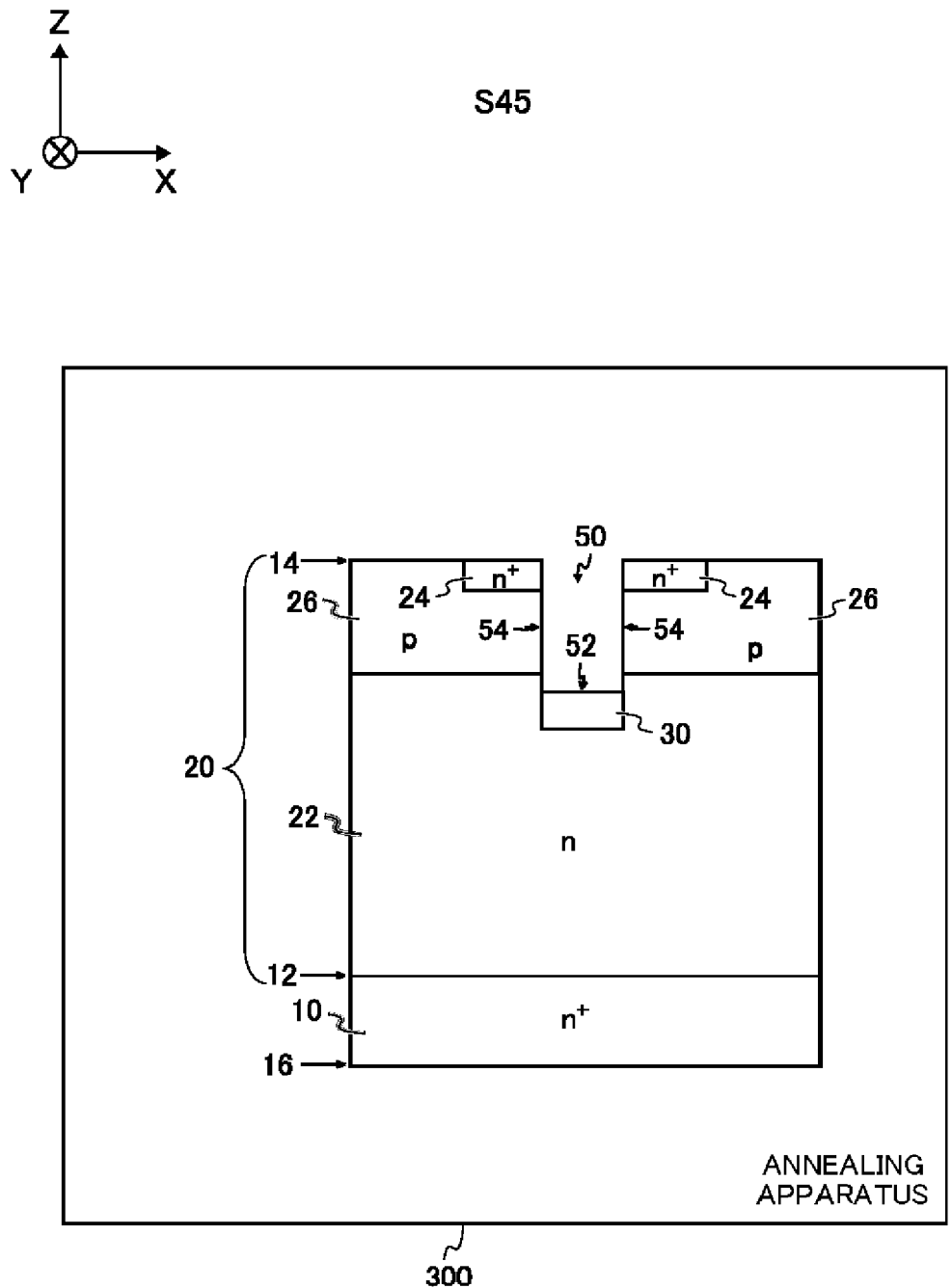
FIG. 3F is a schematic view showing a step S45.

FIG. 3F is a schematic view showing the step S45. In the step S45 of the present example, the GaN layer 20 is annealed by using the annealing apparatus 300. Accordingly, the high resistance region 30 is formed. Note that nitrogen gas ($N_2$ gas) may be filled in the treatment chamber of the annealing apparatus 300 during annealing.

The GaN layer 20 may be annealed at a temperature of equal to or more than 700° C. and equal to or less than 1300° C., and more preferably, at a temperature of equal to or more than 1000° C. and equal to or less than 1300° C. On the other hand, in a case where the compound semiconductor layer is a SiC layer, the SiC layer may be annealed at a temperature of equal to or more than 1000° C. and equal to or less than 1500° C., and more preferably, at a temperature equal to or more than 1300° C. and equal to or less than 1500° C. By annealing at a temperature within the above-described range, the crystallinity broken due to the ion implantation can be repaired to some extent. That is, the state can be returned from the amorphous state to the crystal state to some extent.

If the region where the ion implantation has been performed is left in the amorphous state, there is a risk that the characteristics of the vertical MOSFET 100 may be changed due to the heat generated during the operation of the vertical MOSFET 100. In the present example, the change of the characteristics during the operation can be prevented by repairing the crystallinity to some extent. Accordingly, an operational reliability of the vertical MOSFET 100 can be secured. Of course, if the temperature is within the above-described range, no p type characteristic is exhibited in the p type impurities as the resistance-increasing element ion-implanted into the GaN layer 20 or the SiC layer.

Note that, as a comparison example, in a case where the semiconductor layer is Si, after B (the p type impurities) with the impurity concentration of equal to or more than $1.0E+16$ cm$^{-3}$ and equal to or less than $1.0E+19$ cm$^{-3}$ is ion-implanted, as the semiconductor layer is annealed at the temperature which is for repairing the crystallinity, the region where the ion implantation has been performed becomes the p type region. That is, if the semiconductor layer is Si, the high resistance region 30 like the present example cannot be obtained. Also, if the semiconductor layer is Si, the resistance of the p type region becomes lower in proportion to the p type impurity concentration.

Figure 3G:
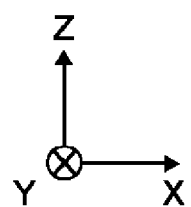
FIG. 3G is a schematic view showing a step S50.
Figure 3G:
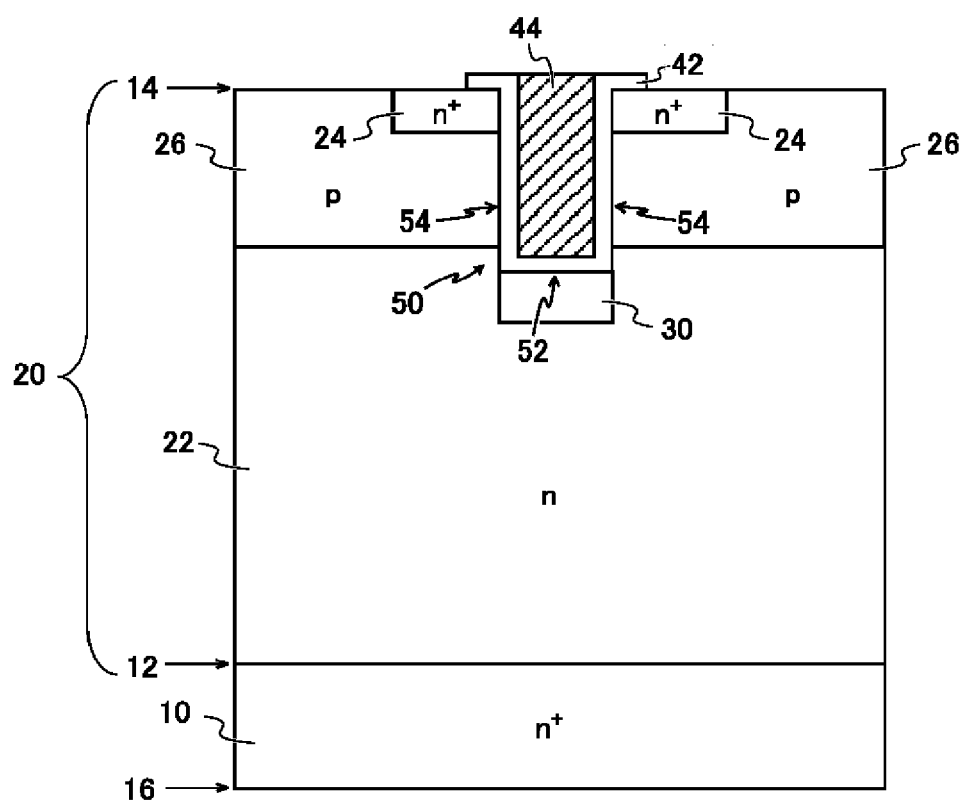

FIG. 3G is a schematic view showing the step S50. In the step S50 of the present example, the gate insulating film 42 and the gate electrode 44 are formed. The gate insulating film 42 may have a thickness of 100 nm. The gate insulating film 42 may be a $SiO_2$ film or may be an aluminum oxide ($Al_2O_3$) film. The gate electrode 44 may be polysilicon. The gate insulating film 42 and the gate electrode 44 may be patterned in desired shapes by using a known photolithographic technique.

Figure 3H:
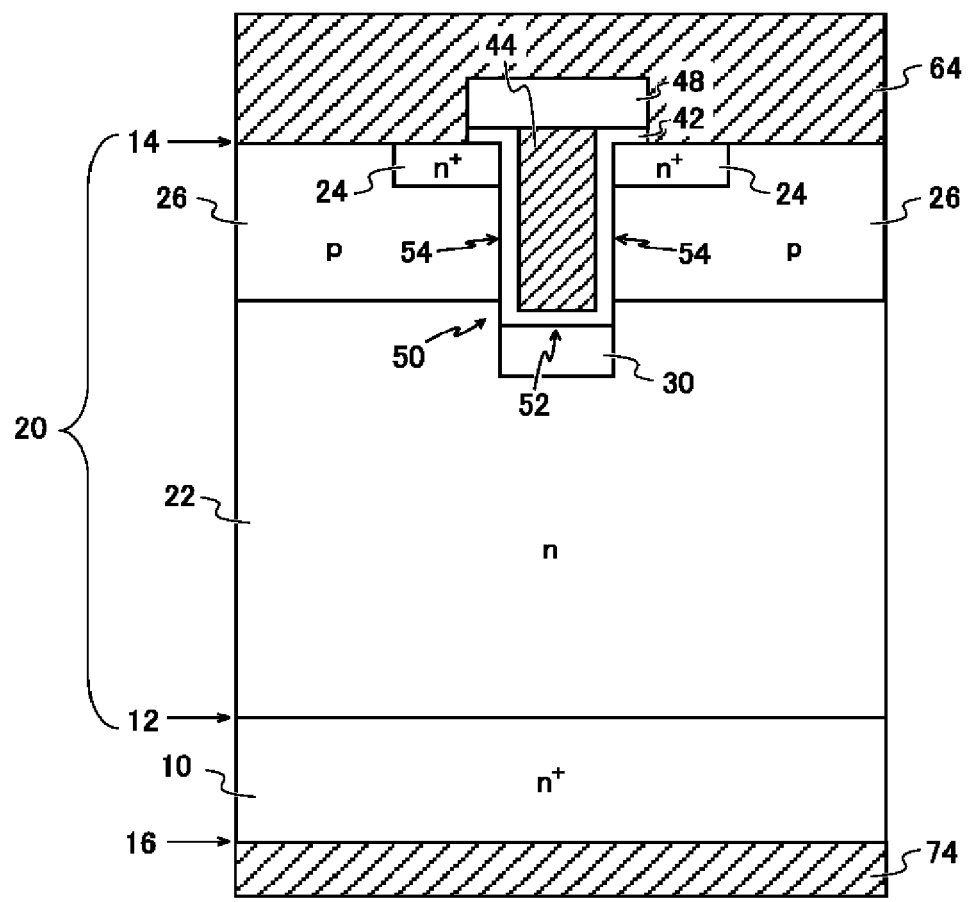
FIG. 3H is a schematic view showing a step S60.

FIG. 3H is a schematic view showing the step S60. In the step S60 of the present example, the interlayer insulating film 48, the source electrode 64, and the drain electrode 74 are formed. The interlayer insulating film 48 may be BPSG (Borophosphosilicate glass). The source electrode 64 may be a laminated electrode having a Ti (titanium) layer and an Al layer on the Ti layer. The drain electrode 74 may be a laminated electrode having a Ti layer below the back surface 16 and an Al layer below the Ti layer.

Figure 4:
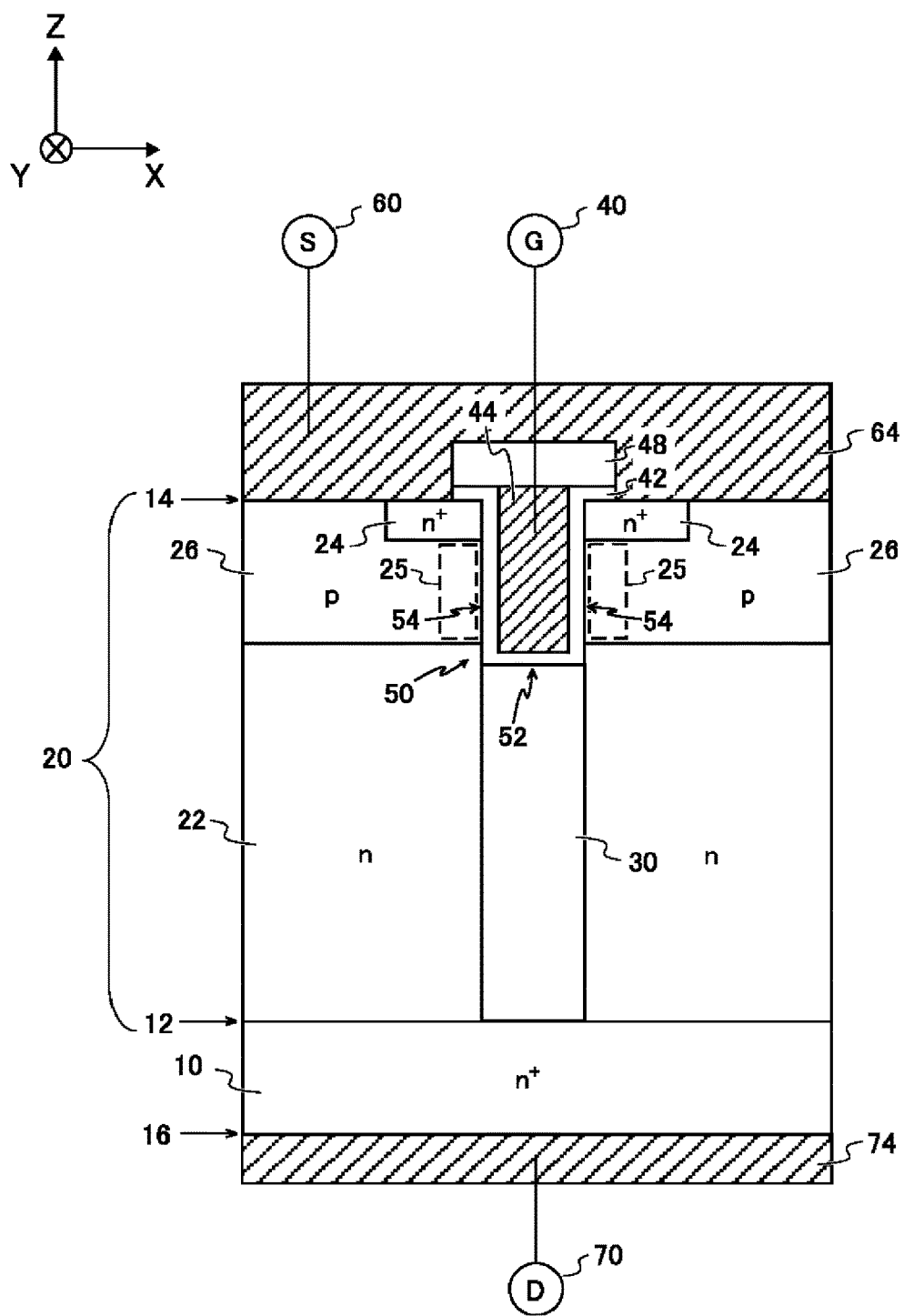
FIG. 4 is a schematic view showing a cross section of a vertical MOSFET 120 in a first modification example.

FIG. 4 is a schematic view showing a cross section of a vertical MOSFET 120 in a first modification example. The high resistance region 30 of the present example is provided in the drift region 22 across the entire Z direction from the bottom portion 52 to the boundary surface 12. The present example is different from the first embodiment in the above point. The present example may also receive the advantageous effect in the first embodiment.

Figure 5:
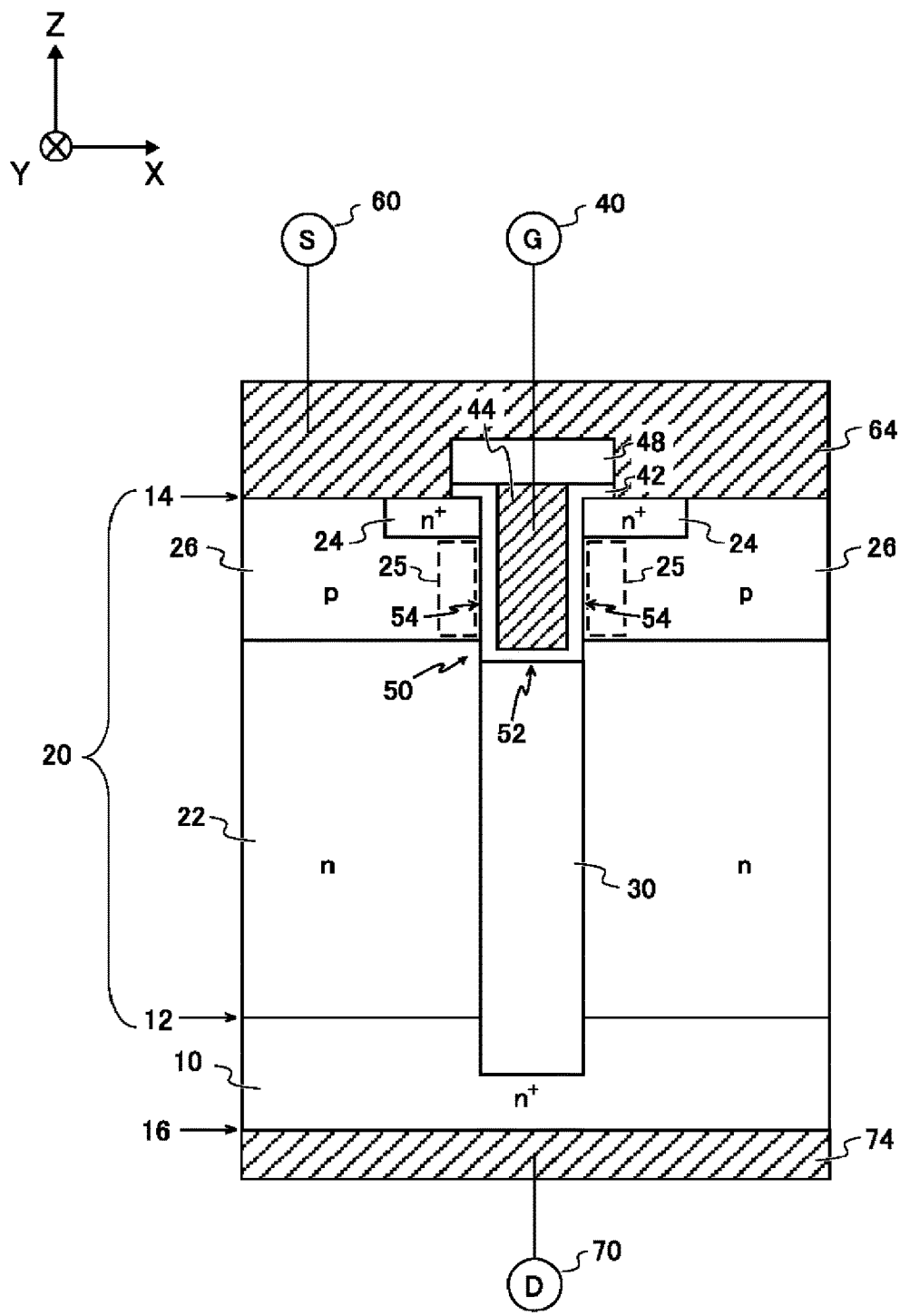
FIG. 5 is a schematic view showing a cross section of a vertical MOSFET 140 in a second modification example.

FIG. 5 is a schematic view showing a cross section of a vertical MOSFET 140 in a second modification example. The high resistance region 30 of the present example is provided from the bottom portion 52 to the inside of the GaN substrate 10 through the boundary surface 12. The present example is different from the first embodiment in the above point. The present example may also receive the advantageous effect in the first embodiment.

Figure 6:
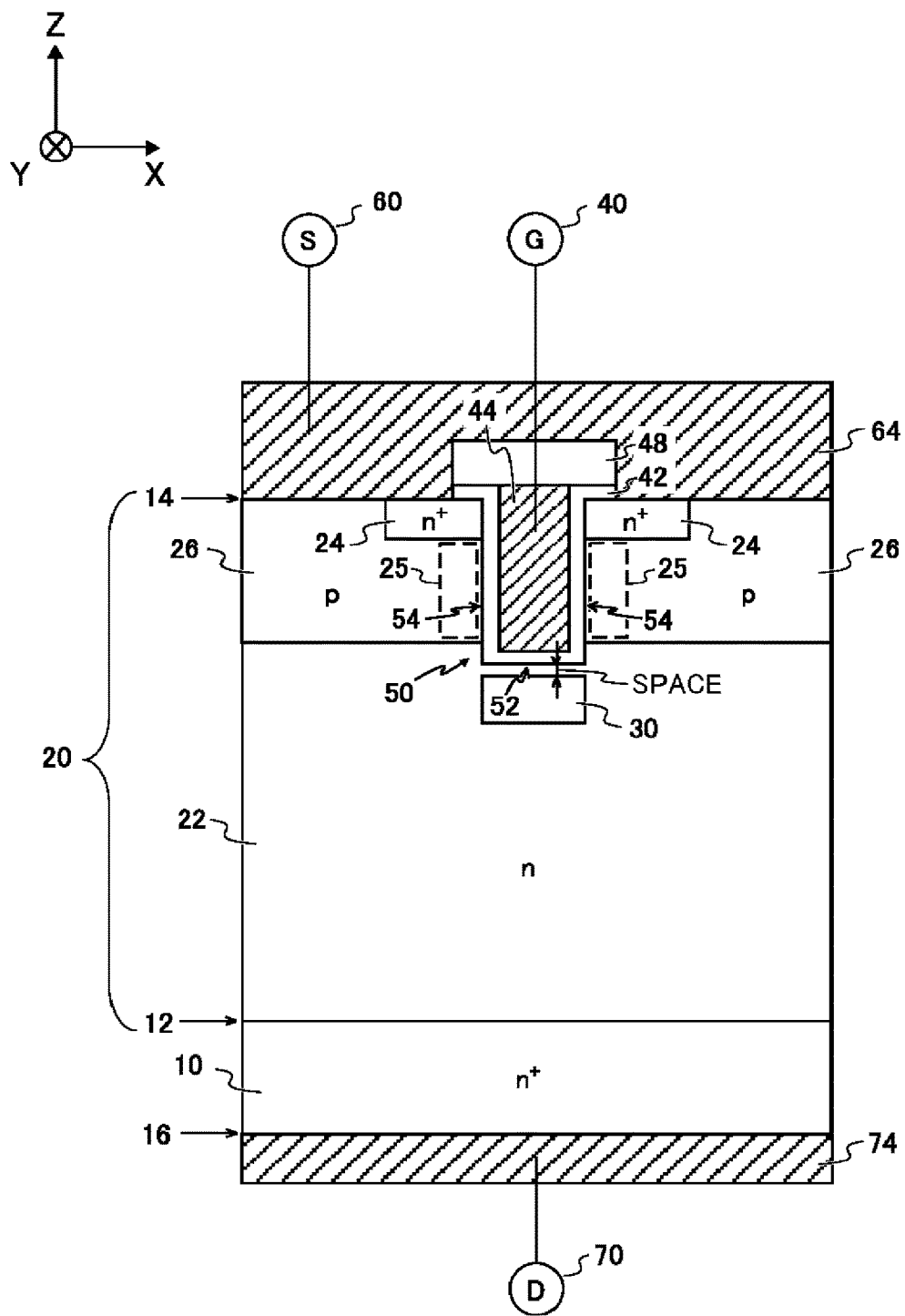
FIG. 6 is a schematic view showing a cross section of a vertical MOSFET 160 in a second embodiment.

FIG. 6 is a schematic view showing a cross section of a vertical MOSFET 160 in a second embodiment. The high resistance region 30 of the present example is spaced from the gate insulating film 42 below at least a part of the gate insulating film 42. In the present example having the trench portion 50, the high resistance region 30 is provided separating from the bottom portion 52 below the bottom portion 52. Note that the position where the high resistance region 30 is to be formed may be controlled by controlling the acceleration voltage during the forming of the high resistance region 30. The present example is different from the first embodiment in the above point, but is the same as the first embodiment in the other points.

In a case where the gate insulating film 42 and the high resistance region 30 are directly in contact with each other, the MOS interface characteristics are vulnerable to damages on the compound semiconductor layer when the resistance-increasing element is ion-implanted into the compound semiconductor layer. For example, the increased accumulation of electric charges on the gate insulating film 42 may result in the degradation and breakdown of the gate insulating film 42 in some cases. For this reason, like the present example, the influence of the damages during the ion implantation can be reduced by providing the high resistance region 30 spaced from the bottom portion 52. Note that like the first modification example, the high resistance region 30 of the present example may be provided in the drift region 22 to the boundary surface 12 across the entire Z direction. Instead of this, like the second modification example, the high resistance region 30 of the present example may be provided in the drift region 22 across the entire Z direction and to the inside of the GaN substrate 10 through the boundary surface 12.

Note that a width of the high resistance region 30 of the present example is the same as a width of the trench portion 50. In the present example, the width of the high resistance region 30 is a length in the x direction of the high resistance region 30. Also, in the present example, the width of the trench portion 50 is a length in the x direction between the side portions 54 of the trench portion 50.

Figure 7:
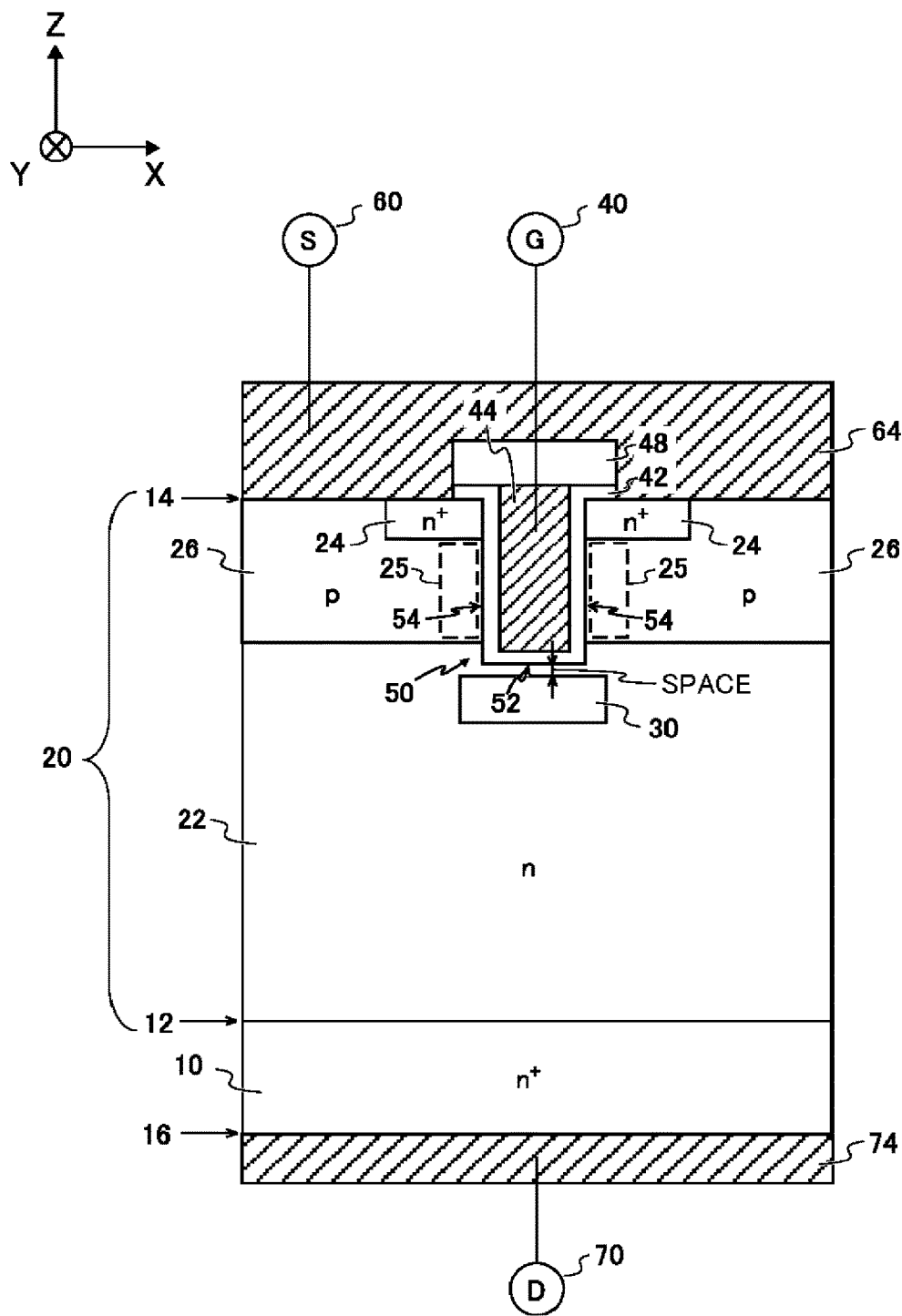
FIG. 7 is a schematic view showing a cross section of a vertical MOSFET 170 in a modification example of the second embodiment.

FIG. 7 is a schematic view showing a cross section of a vertical MOSFET 170 in a modification example of the second embodiment. The width of the high resistance region 30 of the present example is wider than the width of the trench portion 50. Note that the width of the high resistance region 30 may be made to be wider than the width of the trench portion 50 by inclining the direction of the ion implantation relative to the front surface 14. The present example is different from the second embodiment in the above point, but is the same as the second embodiment in the other points.

FIG. 7 is a unit structure of the vertical MOSFET 170, and the same unit structures are provided in the x direction. If the high resistance region 30 is not connected to the adjacent high resistance region 30 of the unit structure, the high resistance region 30 may be further extended in the x direction. In this way, by making the width of the high resistance region 30 be wider than the width of the trench portion 50, the withstand voltage of the semiconductor apparatus can be improved compared to a case where the width of the high resistance region 30 is the same as that of the trench portion 50.

Note that in another modification example, the width of the high resistance region 30 may be made narrower than the width of the trench portion 50. Since the ON resistance can be reduced as the width of the high resistance region 30 is narrower than the width of the trench portion 50, a turn on loss can be reduced.

Figure 8:
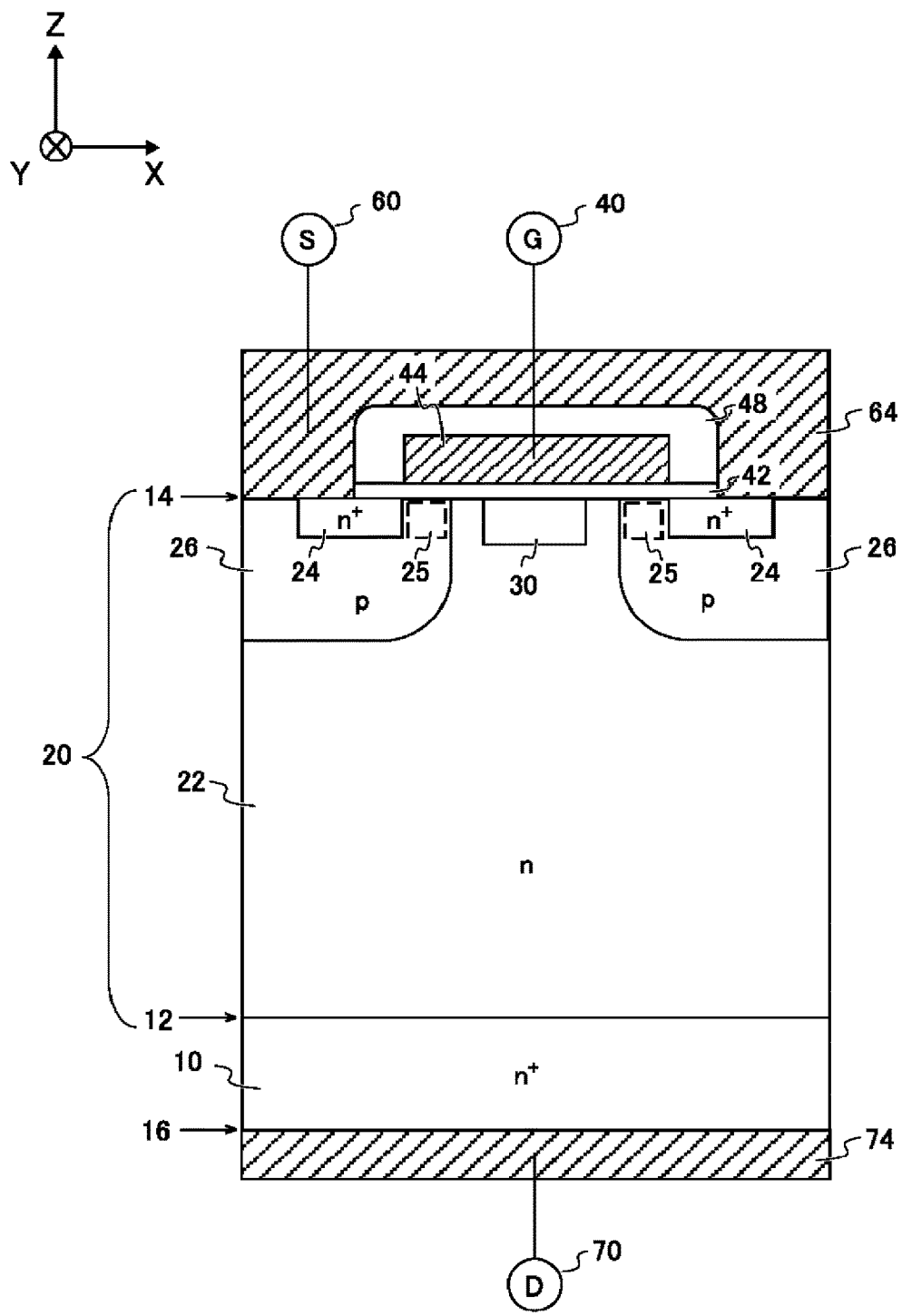
FIG. 8 is a schematic view showing a cross section of a vertical MOSFET 200 in a third embodiment.

FIG. 8 is a schematic view showing a cross section of a vertical MOSFET 200 in a third embodiment. Aiming at a brief description, the descriptions for matters in common with the first embodiment are omitted. The vertical MOSFET 200 of the present example does not have the trench portion 50. The gate electrode 44 of the present example is a planar type and is provided above the front surface 14. Also, the gate insulating film 42 of the present example is provided between the gate electrode 44 and the front surface 14. The high resistance region 30 of the present example is positioned between the pair of base regions 26 and is provided adjacent to the front surface 14. Note that although the pair of base regions 26 are shown in the cross-sectional view of FIG. 6, the base regions 26 may be annular regions extending in the Y direction. The channel forming region 25 is positioned within the base region 26 which is just below the gate electrode 44.

Figure 9:
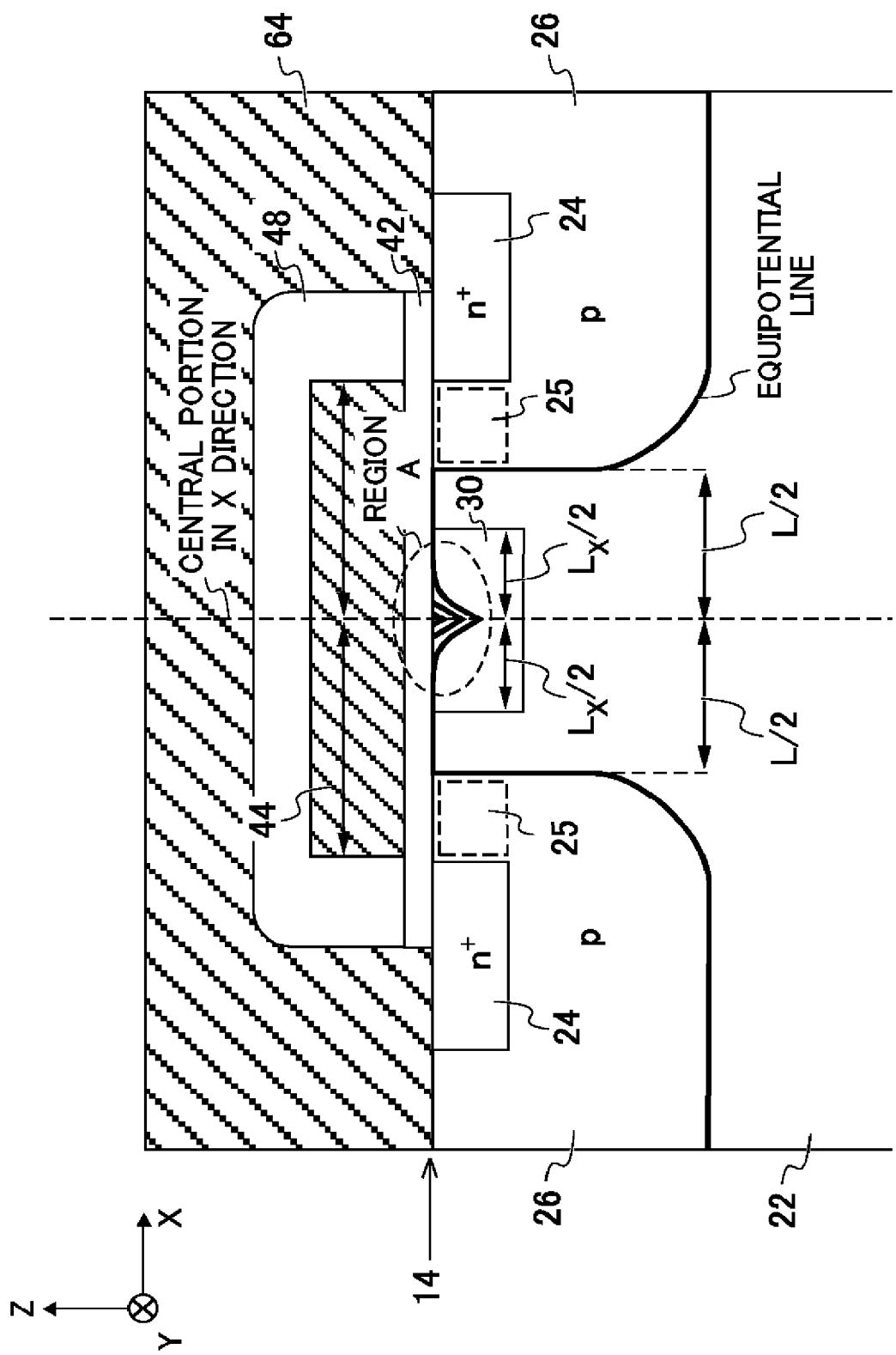
FIG. 9 is a drawing describing a potential distribution when a gate is turned off.

FIG. 9 is a drawing describing a potential distribution when the gate is turned off. When the gate is turned off, the bottom portions and the side portions of the base regions 26 and the front surface 14 between the pair of base regions 26 become equipotential (the equipotential lines thereof are shown in bold lines). However, in the vicinity of the front surface 14 below the central portion in the X direction of the gate electrode 44 (in the vicinity of the front surface 14 of the central portion in the X direction of the pair of base regions 26), the equipotential lines easily protrude downward due to the influence of the voltage of the drain electrode 74. Since intervals of the equipotential lines are dense in a region from the equipotential lines protruding downward to the front surface 14, the region becomes a region (shown as a region A) where the electric field is relatively strong. That is, the breakdown or degradation of the gate insulating film 42 of the present example is easily generated in the region A.

Here, in the present example, the high resistance region 30 is provided below the central portion in the X direction of the gate electrode 44. The high resistance region 30 of the present example is also provided within the drift region 22 by ion implantation. The high resistance region 30 of the present example is provided directly in contact with at least a lower surface of a part of the gate insulating film 42. The high resistance region 30 may have a prescribed width in the X direction. The high resistance region 30 may have a width of $L_X/2$ in the $\pm X$ directions with a center which is the central portion in the X direction of the gate electrode 44.

In order to secure a conduction path of a current I between the source terminal 60 and the drain terminal 70, it is desirable that the width $L_X$ in the X direction of the high resistance region 30 is smaller than a width L in the X direction between the pair of base regions 26. In the present example, the width $L_X$ of the high resistance region 30 may be set to a width of equal to or more than 20% of and equal to or less than 80% of the width L between the pair of base regions 26, or may be set to be a width of equal to or more than 30% of and equal to or less than 70% of the width L between the pair of base regions 26.

If $L_X$ is set wider, since the drift region 22 remained between the base regions 26 becomes narrower, the ON resistance increases according to JFET effect. Note that JFET effect means that a depletion layer extends from adjacent channel forming regions 25 according to the electric field between the source and the drain when the MOSFET is operated, and the path of the current is narrowed. On the other hand, if $L_X$ is set wider, the gate insulating film 42 is further protected. For this reason, $L_X$ may be determined according to the necessity of protection of the gate insulating film 42.

Figure 10:
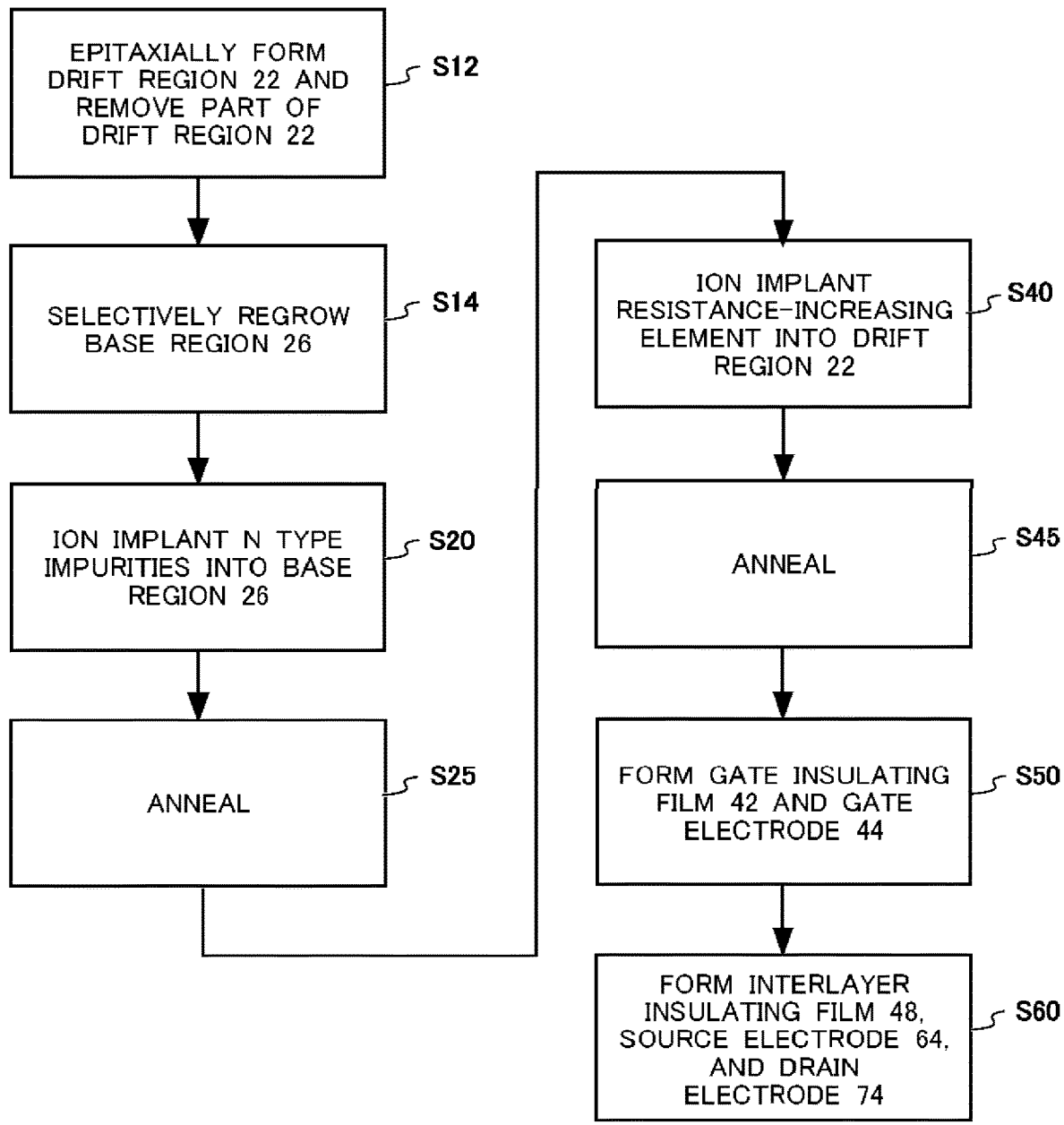
FIG. 10 is a flow diagram showing manufacturing steps of the vertical MOSFET 200.

FIG. 10 is a flow diagram showing manufacturing steps of the vertical MOSFET 200. The manufacturing steps of the present example are performed in an order of S12 to S60. The manufacturing steps of the present example include a step (S12) of epitaxially forming the drift region 22 and removing a part of the drift region 22, a step (S14) of selectively regrowing the base region 26, a step (S20) of ion implanting the n type impurities into the base region 26, a step (S25) of annealing the GaN layer 20 to form the source region 24, a step (S40) of ion implanting the resistance-increasing element into the drift region 22, a step (S45) of annealing the GaN layer 20 to form the high resistance region 30, a step (S50) of forming the gate insulating film 42 and the like, and a step (S60) of forming the interlayer insulating film 48 and the like.

Figure 11A:
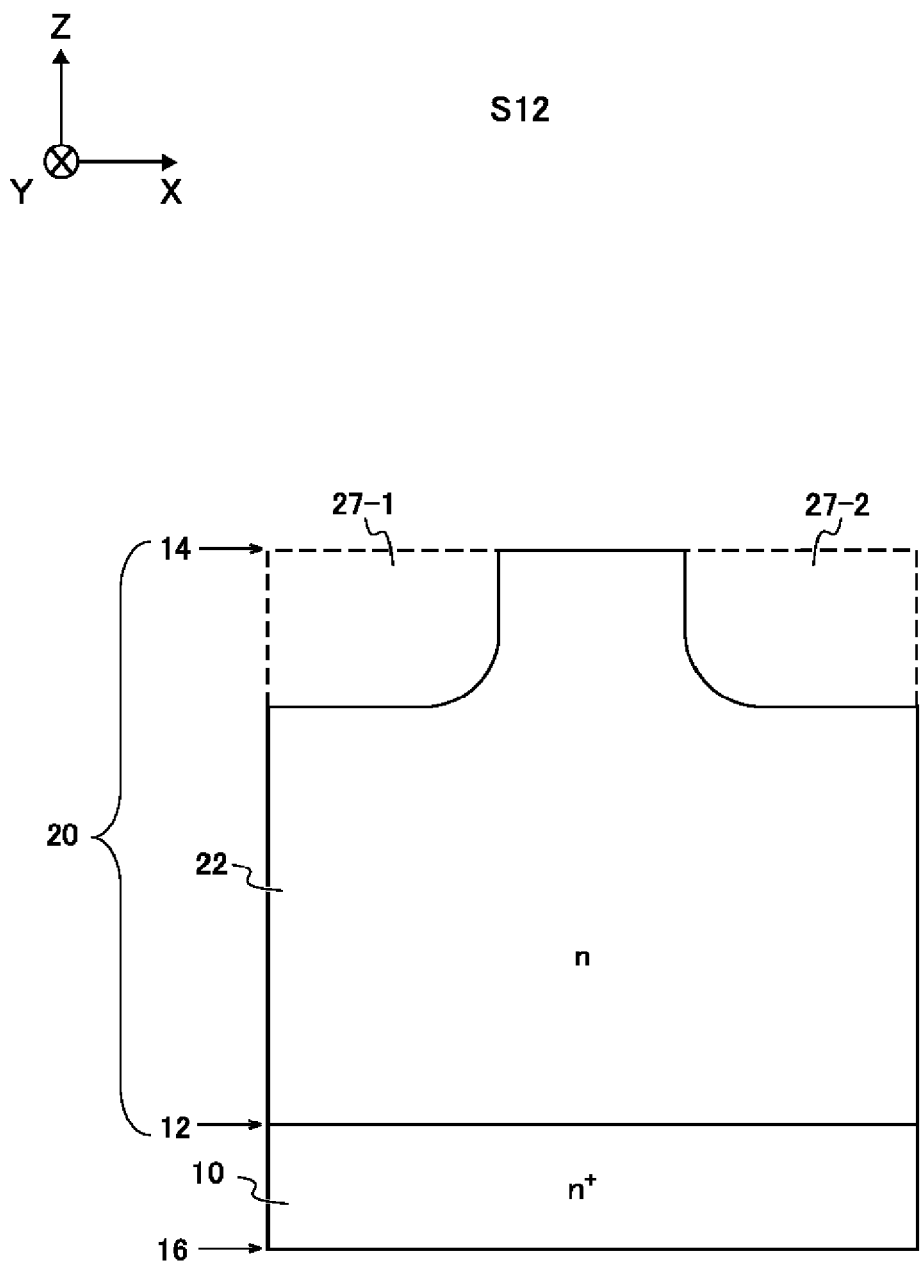
FIG. 11A is a schematic view showing a step S12.

FIG. 11A is a schematic view showing the step S12. In the step S12 of the present example, the n type drift region 22 is epitaxially formed directly in contact with an upper surface of the GaN substrate 10. After that, in the etching apparatus, a part of the upper portion of the drift region 22 is removed by etching. Accordingly, concave portions 27 are formed in the drift region 22.

Figure 11B:
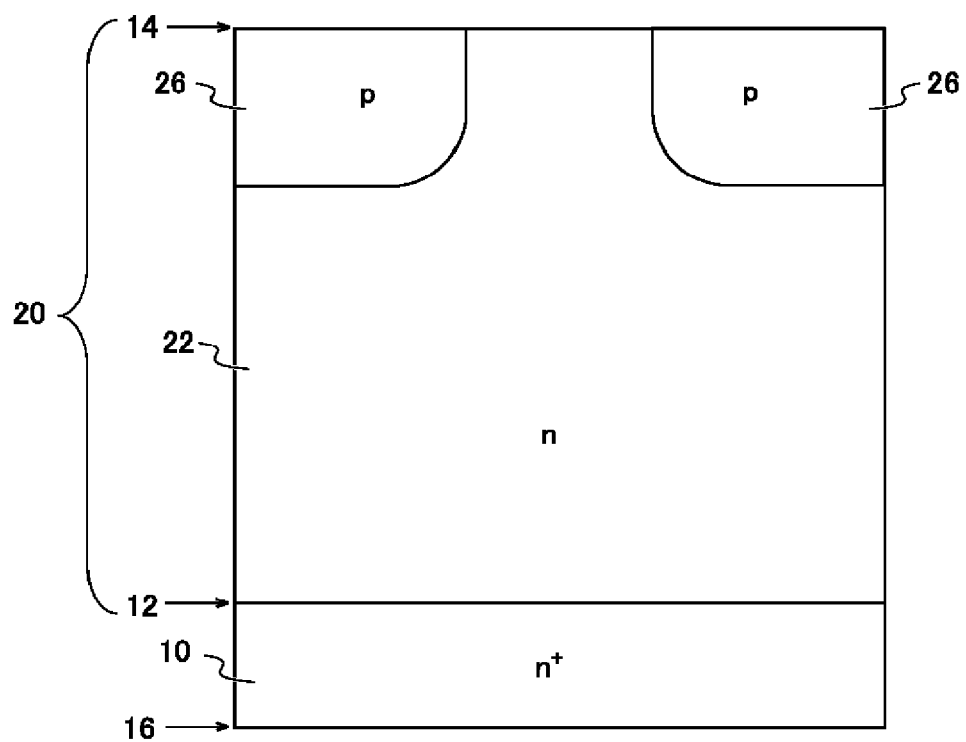
FIG. 11B is a schematic view showing a step S14.

FIG. 11B is a schematic view showing the step S14. In the step S14 of the present example, the p type base region 26 is selectively regrown on the concave portions 27 of the drift region 22. During the selective regrowing, the base region 26 is epitaxially formed.

Figure 11C:
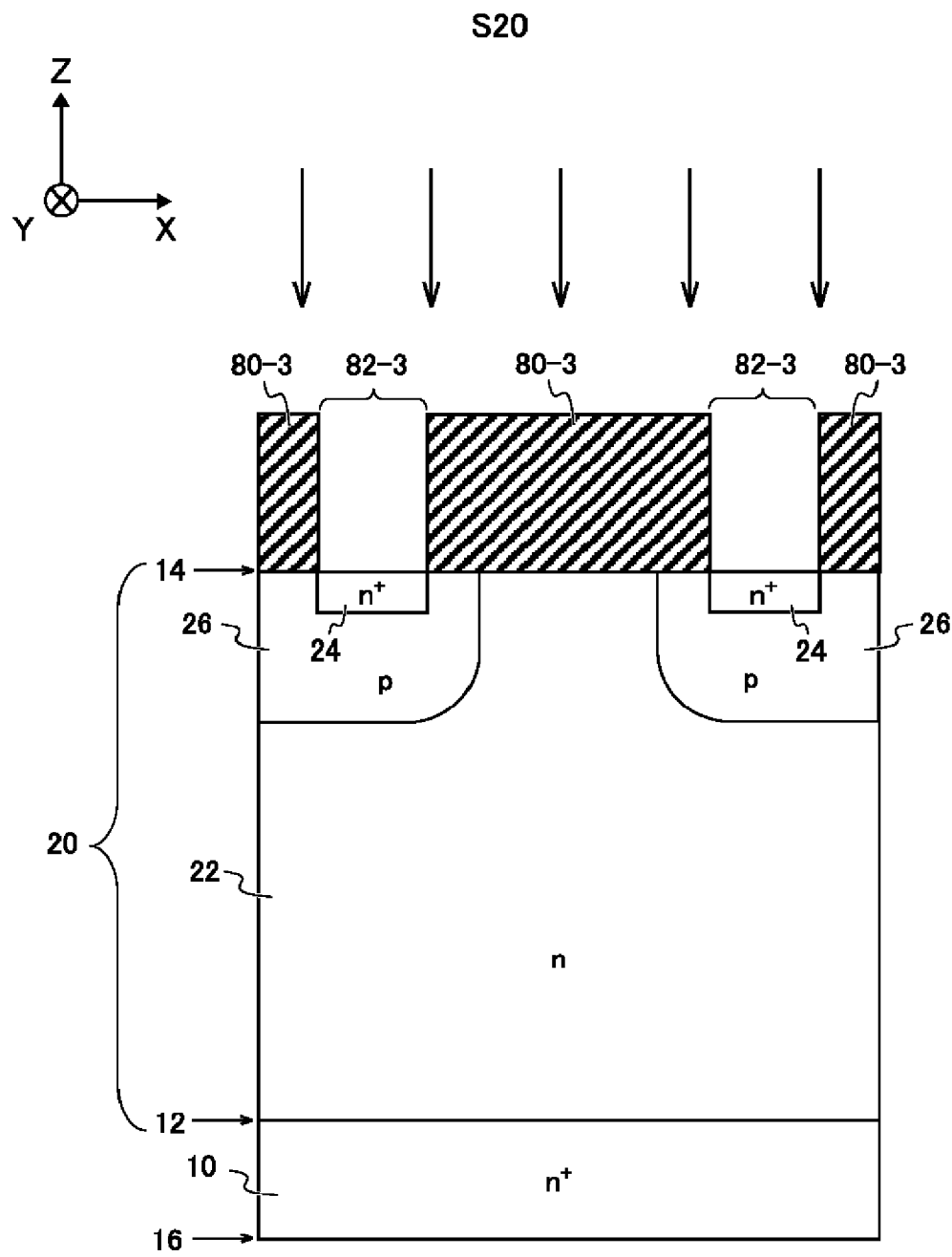
FIG. 11C is a schematic view showing a step S20.

FIG. 11C is a schematic view showing the step S20. In the step S20, similar to the first embodiment, the n type impurities are ion-implanted into the base region 26 by using a mask 80-3.

Figure 11D:
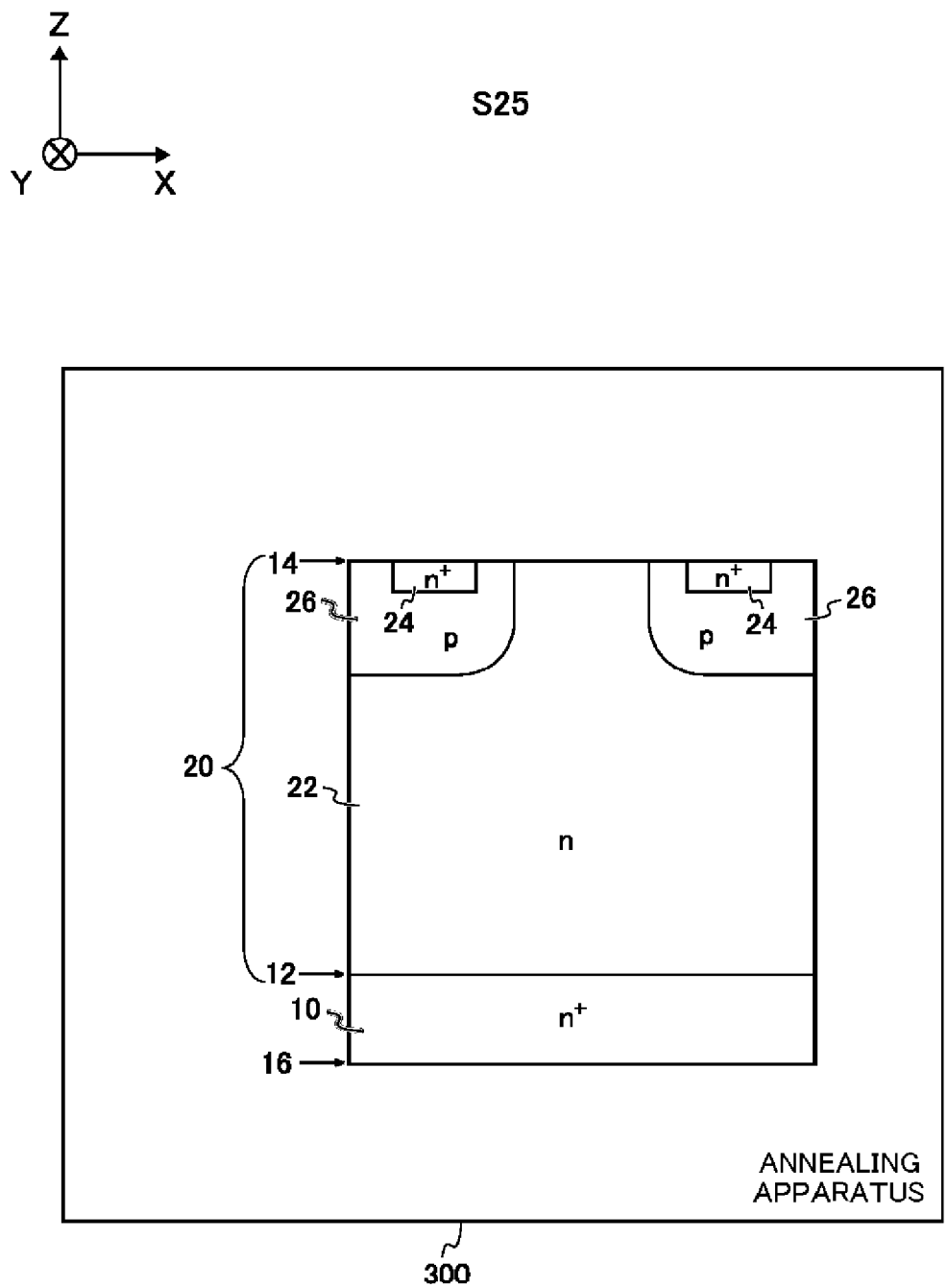
FIG. 11D is a schematic view showing a step S25.

FIG. 11D is a schematic view showing the step S25. In the step S20, similar to the first embodiment, the GaN layer 20 is annealed. Accordingly, the n$^+$ type source region 24 is formed.

Figure 11E:
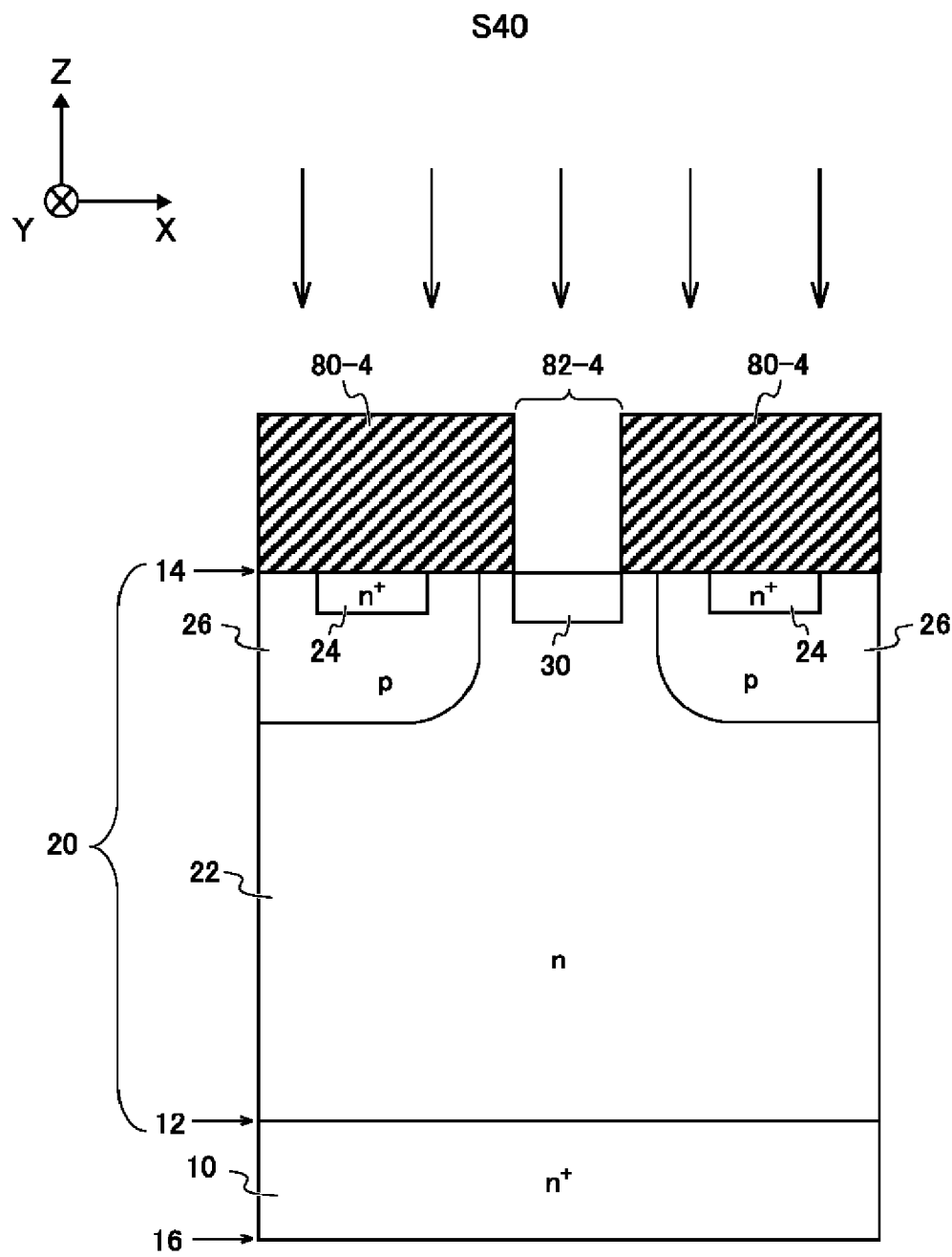
FIG. 11E is a schematic view showing a step S40.

FIG. 11E is a schematic view showing the step S40. In the step S40, similar to the first embodiment, the resistance-increasing element is ion-implanted into the base region 26 by using a mask 80-4. In the present example, the ion implantation of the resistance-increasing element is performed so that a box profile is formed from the front surface 14 between the pair of base regions 26 to a depth within a prescribed range.

Figure 11F:
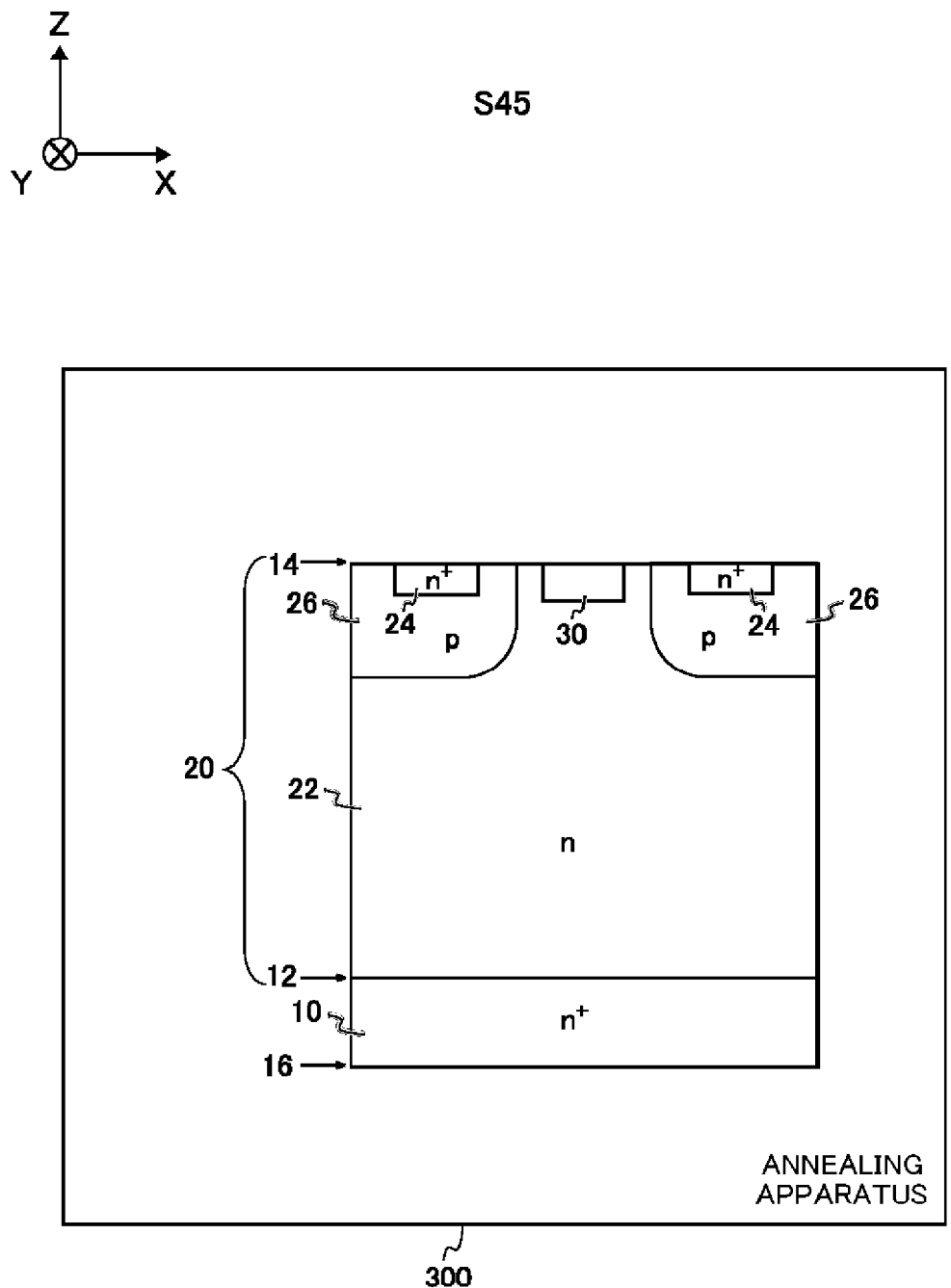
FIG. 11F is a schematic view showing a step S45.

FIG. 11F is a schematic view showing the step S45. In the step S45, similar to the first embodiment, the GaN layer 20 is annealed.

Figure 11G:
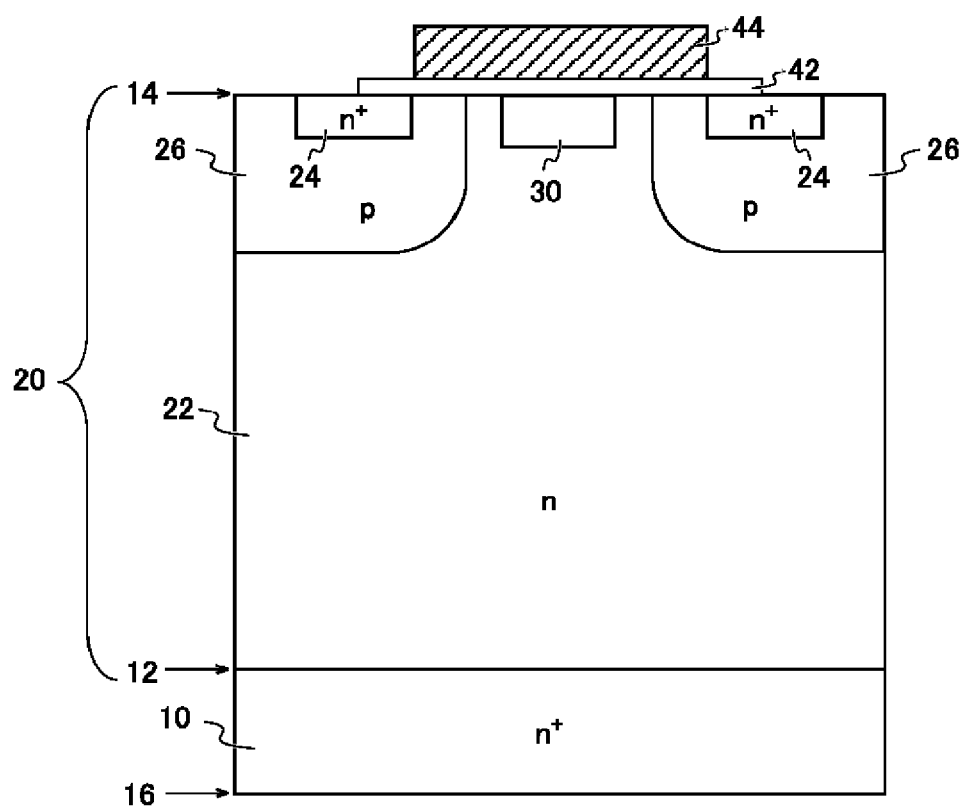
FIG. 11G is a schematic view showing a step S50.

FIG. 11G is a schematic view showing the step S50. In the step S50, the gate insulating film 42 and the gate electrode 44 are formed.

Figure 11H:
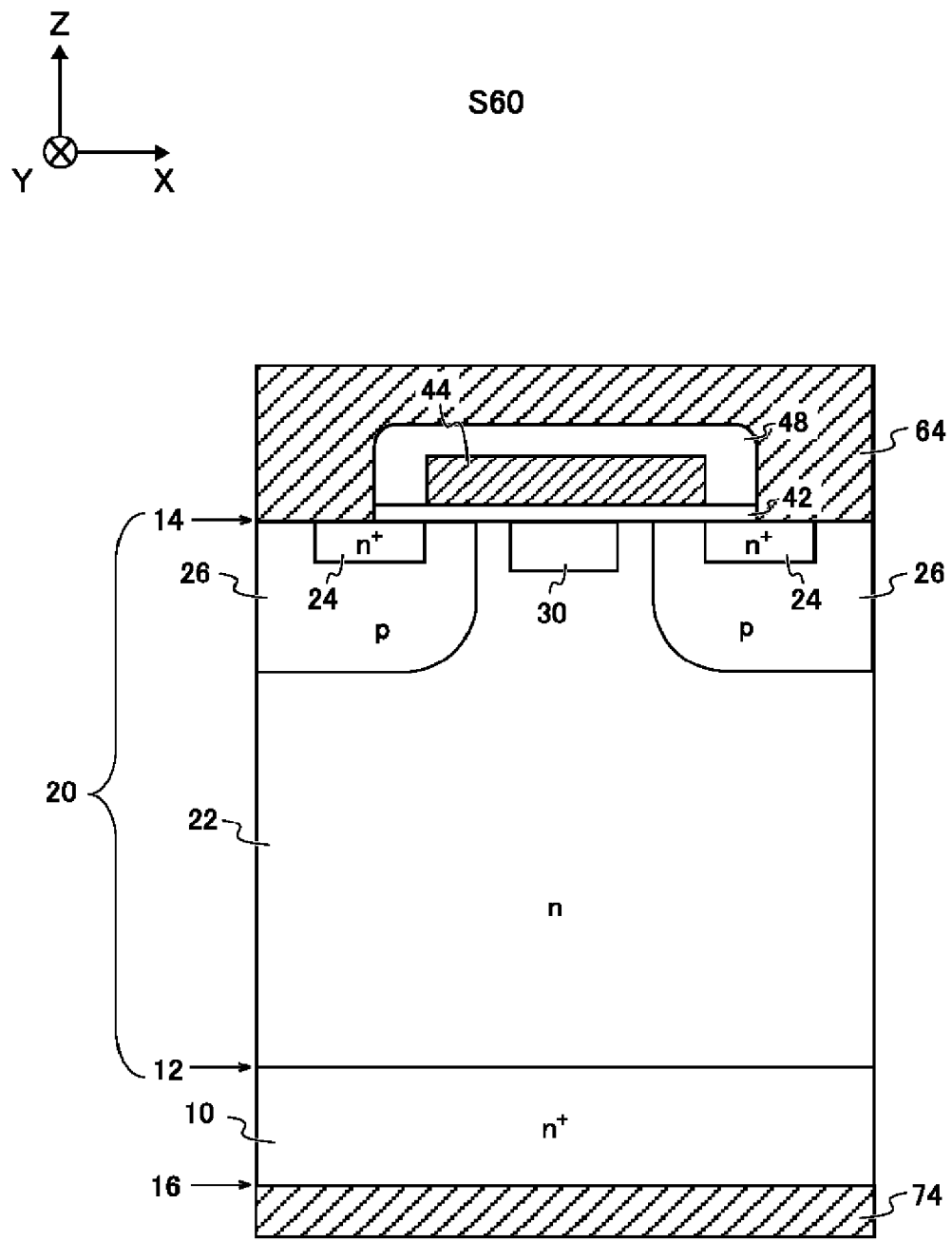
FIG. 11H is a schematic view showing a step S60.

FIG. 11H is a schematic view showing the step S60. In the step S60, the interlayer insulating film 48 is formed so as to cover the side portion and the upper portion of the gate electrode 44. Also, similar to the first embodiment, the source electrode 64 and the drain electrode 74 are formed.

Figure 12:
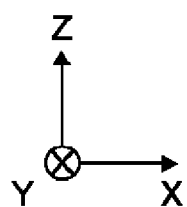
FIG. 12 is a schematic view showing a cross section of a vertical semiconductor apparatus 400 in a first experiment example.
Figure 12:
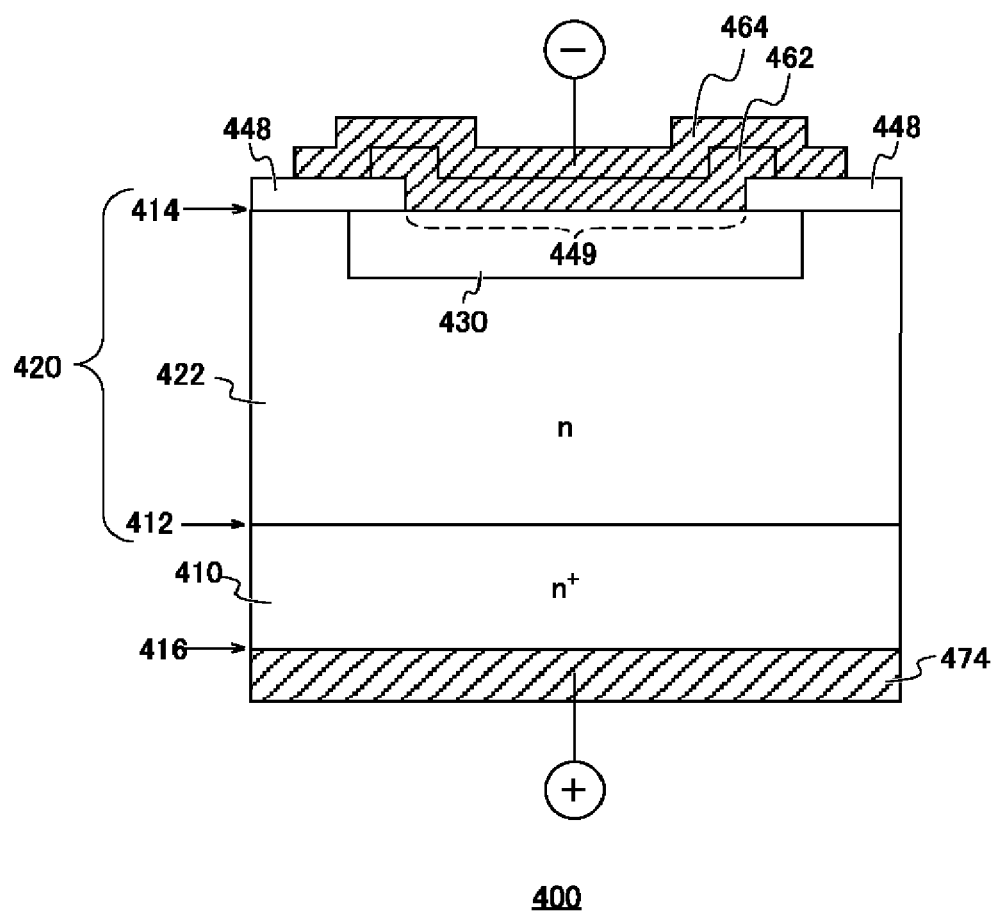

FIG. 12 is a schematic view showing a cross section of a vertical semiconductor apparatus 400 in a first experiment example. The first experiment example is an experiment for ensuring that the high resistance region 430 serves as an insulator. The vertical semiconductor apparatus 400 has a GaN substrate 410, a GaN layer 420, an insulating film 448, a contact metal 462, a low-voltage-side electrode 464, and a high-voltage-side electrode 474. The GaN layer 420 has a boundary surface 412, which is between the GaN substrate 410 and the GaN layer 420, and a front surface 414. The GaN layer 420 has the drift region 422 and a high resistance region 430.

The drift region 422 is a region of n type GaN, epitaxially formed on the GaN substrate 10. The thickness in the Z direction of the drift region 422 was set to 11 μm. Also, the n type impurity concentration of the drift region 22 was set to $1.5E+16$ $cm^{-3}$. The high resistance region 430 was formed by ion implanting Mg into the drift region 422 as the resistance-increasing element followed by the annealing of the GaN layer 420. The annealing temperature was set to 1300° C. The depth of the high resistance region 430 was set to 0.5 μm and the impurity concentration of Mg was set to $1E+18$ $cm^{-3}$.

An insulating film 448 was provided on the front surface 414 of the GaN layer 420. The insulating film 448 was set as a $SiO_2$ film. An opening 449 for contact was provided to the insulating film 448. The high resistance region 430 was exposed to the entire opening 449 in the X-Y plane.

A contact metal 462 was provided on the insulating film 448. A lower surface of the contact metal 462 was contacted to the high resistance region 430 only through the opening 449. Ni (nickel) was used in the contact metal 462. Note that it may be considered that the same result as the first experiment example can be obtained even if the contact metal 462 is made of Pd (palladium) or Pt (platinum). The low-voltage-side electrode 464 was provided on an upper surface of the contact metal 462. Al was used in the low-voltage-side electrode 464 of the present experiment. Note that by extending the low-voltage-side electrode 464 in the ±X directions than the high resistance region 430, the extended part of the low-voltage-side electrode 464 was used as a field plate.

The high-voltage-side electrode 474 was provided below the back surface 416, directly in contact with the GaN substrate 410. Grounding the low-voltage-side electrode 464, the voltage of the high-voltage-side electrode 474 was increased from 0V to above 1300V. At this moment, the current flowing between the low-voltage-side electrode 464 and the high-voltage-side electrode 474 was measured.

Figure 13:
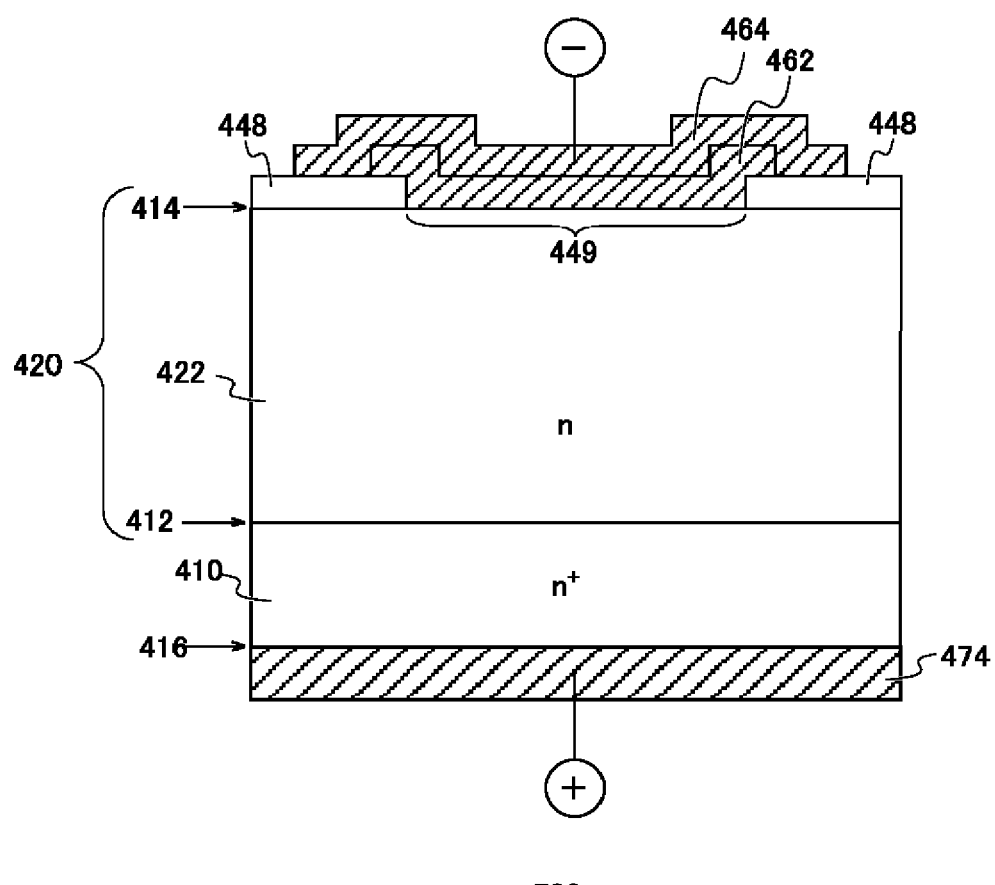
FIG. 13 is a schematic view showing a cross section of a vertical semiconductor apparatus 500 in a second experiment example.

FIG. 13 is a schematic view showing a cross section of a vertical semiconductor apparatus 500 in a second experiment example. The vertical semiconductor apparatus 500 does not have the high resistance region 430. That is, in the vertical semiconductor apparatus 500, the contact metal 462 and the drift region 422 were Schottky-joined with each other. Also, grounding the low-voltage-side electrode 464, the voltage of the high-voltage-side electrode 474 was increased from 0V to 1200V. The present example is different from the first experiment example in the above point.

Figure 14:
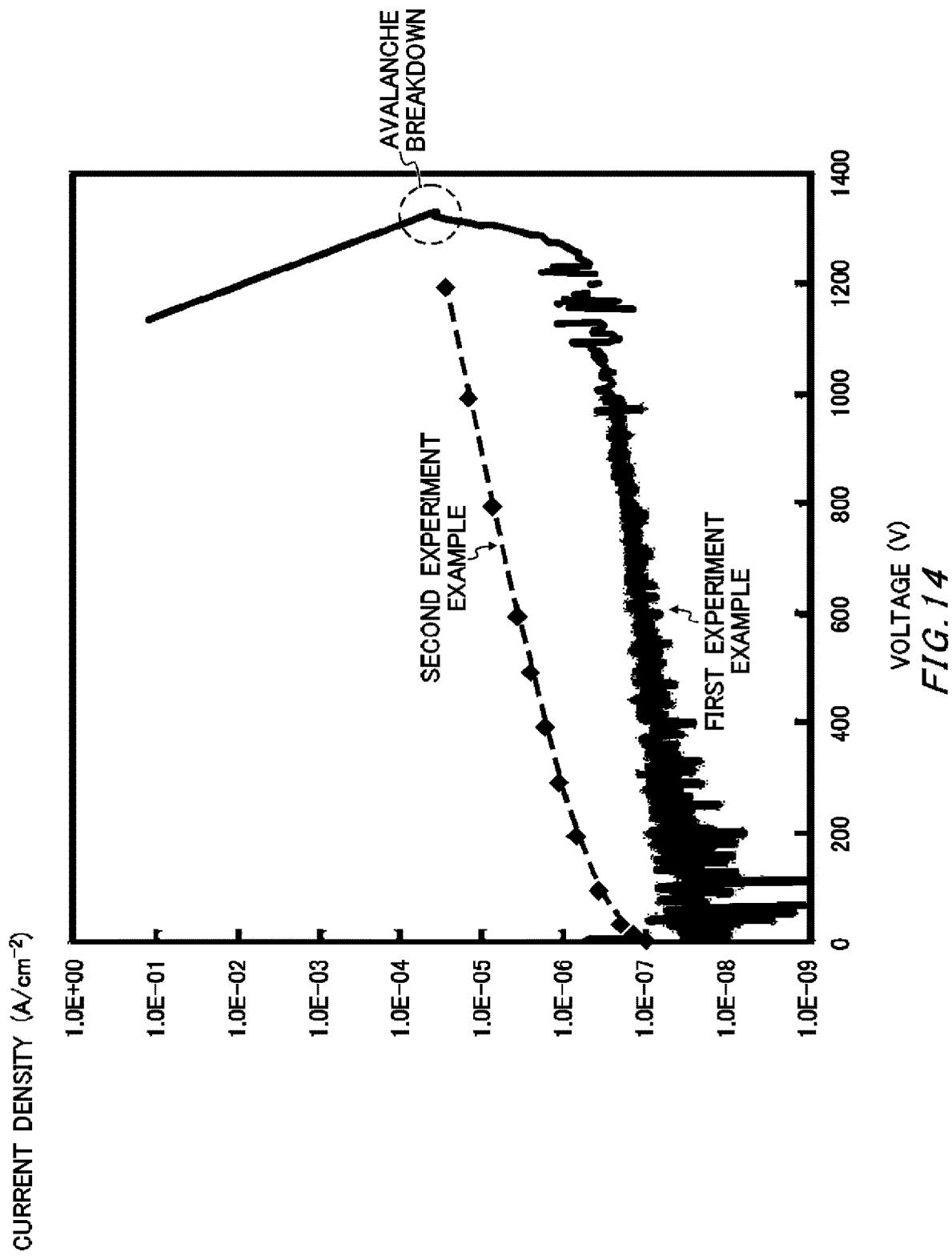
FIG. 14 is a drawing showing a voltage-current characteristic in the vertical semiconductor apparatuses 400 and 500.

FIG. 14 is a drawing showing a voltage-current characteristic in the vertical semiconductor apparatuses 400 and 500. The horizontal axis indicates the voltage (V) applied to the high-voltage-side electrode 474. The vertical axis indicates the current density ($A/cm^{-2}$). The current density was calculated by dividing the currents flowing between the low-voltage-side electrode 464 and the high-voltage-side electrode 474 by the area of the opening 449 in the X-Y plane.

The result of the first experiment example is shown by solid lines. In the first experiment example, the current density was less than 1.0E-7 when the voltage was within a range of equal to or more than 0V and equal to or less than 100V. The current density showed an increasing tendency as the voltage increased. Even if the voltage was equal to 1000V, the current density was less than 1.0E-6. When the voltage was close to 1200V, the current density rapidly increased. When the voltage exceeded 1300V, the avalanche breakdown was generated, and the current density further increased rapidly. Note that the current density of about 1.0E-7 when the voltage was 0V is larger than an ideally expected current density. It is thought that the reason is because of a point defect and a dislocation defect in the epitaxially formed GaN layer 420 and because that the damage due to the ion implantation when the high resistance region 430 was formed cannot be completely eliminated.

The result of the second experiment example is shown by a plurality of plots shown in a diamond shape and dotted lines connecting them. In the second experiment example, the current density was less than 1.0E-6 when the voltage was within a range of equal to or more than 0V and equal to or less than 100V. The current density showed an increasing tendency as the voltage increased. The current density was equal to or more than 1.0E-5 when the voltage was 1000V. The current density of the second experiment example when the voltage was equal to or more than 0V and equal to or less than 1200V was larger than that of the first experiment example by about one or more digits. As expected, since the metal electrode and the n type drift region 422 are Schottky-joined with each other in the vertical semiconductor apparatus 500 of the second experiment example, the current density was higher than that of the vertical semiconductor apparatus 400 of the first experiment example.

Figure 15:
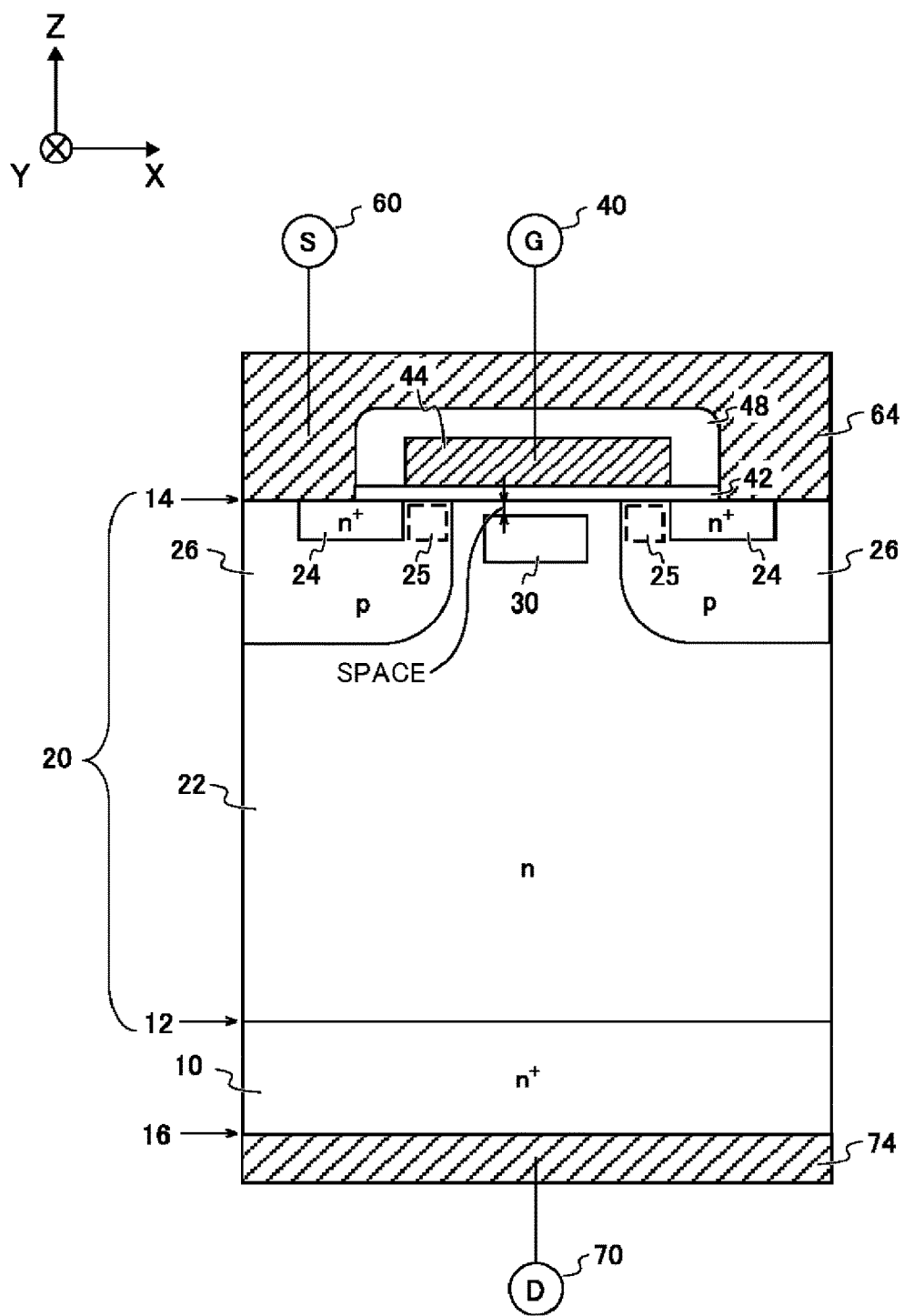
FIG. 15 is a schematic view showing a cross section of a vertical MOSFET 260 in a fourth embodiment.

FIG. 15 is a schematic view showing a cross section of a vertical MOSFET 260 in a fourth embodiment. Similar to the second embodiment, the high resistance region 30 of the present example is spaced from the gate insulating film 42, below at least a part of the gate insulating film 42. The present embodiment is different from the third embodiment in the above point, but is the same as the third embodiment in the other points. The present example is also advantageous in the point that the influence of the damage during the ion implantation can be reduced.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

EXPLANATION OF REFERENCES

10 ... GaN substrate, 12 ... boundary surface, 14 ... front surface, 16 ... back surface, 20 ... GaN layer, 22 ... drift region, 24 ... source region, 25 ... channel forming region, 26 ... base region, 27 ... concave portion, 30 ... high resistance region, 40 ... gate terminal, 42 ... gate insulating film, 44 ... gate electrode, 48 ... interlayer insulating film, 50 ... trench portion, 52 ... bottom portion, 54 ... side portion, 60 ... source terminal, 64 ... source electrode, 70 ... drain terminal, 74 ... drain electrode, 80 ... mask, 82 ... opening, 100, 120, 140, 160, 170, 200, 260 ... vertical MOSFET, 300 ... annealing apparatus, 400 ... vertical semiconductor apparatus, 410 ... GaN substrate, 412 ... boundary surface, 414 ... front surface, 416 ... back surface, 420 ... GaN layer, 422 ... drift region, 430 ... high resistance region, 448 ... insulating film, 449 ... opening, 462 ... contact metal, 464 ... low-voltage-side electrode, 474 ... high-voltage-side electrode, 500 ... vertical semiconductor apparatus

What is claimed is:

1. A vertical MOSFET having a compound semiconductor layer, the vertical MOSFET comprising:
   a gate electrode;
   a gate insulating film which is provided between the gate electrode and the compound semiconductor layer;
   a drift region which is provided directly in contact with at least a part of the gate insulating film and is a part of the compound semiconductor layer; and
   a high resistance region which is provided at least in the drift region, is positioned below at least the part of the gate insulating film, and has a higher resistance value per unit length than that of the drift region, wherein
   the gate electrode is a trench type gate electrode which is embedded in a trench portion that is provided in the compound semiconductor layer,
   the high resistance region is adjacent to a bottom portion of the trench portion,
   the high resistance region is spaced from the gate insulating film and below at least the part of the gate insulating film,
   a width of the high resistance region is wider than a width of the trench portion,
   the high resistance region has a resistance value of equal to or more than 10 Ω·cm per unit length, and
   the compound semiconductor layer is a gallium nitride layer.

2. The vertical MOSFET according to claim 1, wherein the resistance value per unit length of the high resistance region is higher than a resistance value per unit length of a base region which is a part of the compound semiconductor layer.

3. The vertical MOSFET according to claim 1, wherein the high resistance region has a resistance-increasing element with a concentration of equal to or more than 1E+16 cm$^{-3}$ and equal to or less than 1E+19 cm$^{-3}$.

4. The vertical MOSFET according to claim 3, wherein the resistance-increasing element is different from an impurity element which forms majority carriers in the drift region.

5. The vertical MOSFET according to claim 3, wherein the resistance-increasing element is an impurity element which is the same as an impurity element forming majority carriers in a base region that is a part of the compound semiconductor layer.

6. A vertical MOSFET having a gallium nitride layer, the vertical MOSFET comprising:
   a gate electrode;
   a gate insulating film which is provided between the gate electrode and the gallium nitride layer;
   a drift region which is provided directly in contact with at least a part of the gate insulating film and is a part of the gallium nitride layer; and
   a high resistance region which is provided at least in the drift region, is positioned below at least the part of the gate insulating film, and has a higher resistance value per unit length than that of the drift region and is a part of the gallium nitride layer, wherein
   the gate electrode is a trench type gate electrode which is embedded in a trench portion that is provided in the gallium nitride layer,
   the high resistance region is adjacent to a bottom portion of the trench portion,
   a width of the high resistance region is wider than a width of the trench portion,
   the high resistance region has a resistance value of equal to or more than 10 Ω·cm per unit length,
   the high resistance region has a resistance-increasing element with a concentration of equal to or more than 1E+16 cm$^{-3}$ and equal to or less than 1E+19 cm$^{-3}$,
   the high resistance region is formed by annealing at a temperature of equal to or more than 1000° C. and equal to or less than 1300° C. after implantation of the resistance-increasing element, the annealing performed before the gate insulating film is provided,
   the resistance-increasing element is one or more of magnesium, argon, and nitrogen,
   the high resistance region is provided separate from the bottom portion of the trench portion and below the bottom portion, and has electrical characteristics of an insulator, and
   sides of the trench portion are mainly in contact with a base region.

7. The vertical MOSFET according to claim 6, wherein the resistance value per unit length of the high resistance region is higher than a resistance value per unit length of the base region which is a part of the gallium nitride layer.

8. The vertical MOSFET according to claim 6, wherein the resistance-increasing element is different from an impurity element which forms majority carriers in the drift region.

9. The vertical MOSFET according to claim 6, wherein the resistance-increasing element is an impurity element which is the same as an impurity element forming majority carriers in the base region that is a part of the gallium nitride layer.

10. The vertical MOSFET according to claim 6, wherein the resistance-increasing element is magnesium.

11. The vertical MOSFET according to claim 6, wherein the gate electrode extends above a front surface of the gallium nitride layer.

* * * * *